United States Patent
Bosua et al.

(10) Patent No.: US 12,284,021 B2
(45) Date of Patent: *Apr. 22, 2025

(54) SYSTEMS FOR DETERMINING VARIABILITY IN A STATE OF A MEDIUM

(71) Applicant: Know Labs, Inc., Seattle, WA (US)

(72) Inventors: Phillip Bosua, Seattle, WA (US); Dominic Klyve, Seattle, WA (US)

(73) Assignee: KNOW LABS, INC., Seattle, WA (US)

( * ) Notice: Subject to any disclaimer, the term of this patent is extended or adjusted under 35 U.S.C. 154(b) by 29 days.

This patent is subject to a terminal disclaimer.

(21) Appl. No.: 18/330,974

(22) Filed: Jun. 7, 2023

(65) Prior Publication Data

US 2023/0318692 A1 Oct. 5, 2023

Related U.S. Application Data

(63) Continuation of application No. 17/466,346, filed on Sep. 3, 2021, now Pat. No. 11,689,274.

(Continued)

(51) Int. Cl.
*H04B 7/08* (2006.01)
*H04B 7/06* (2006.01)

(52) U.S. Cl.
CPC ............ *H04B 7/0871* (2013.01); *H04B 7/06* (2013.01); *H04B 7/0817* (2013.01)

(58) Field of Classification Search
CPC ...... H04B 7/0871; H04B 7/06; H04B 7/0817; G01R 33/12

(Continued)

(56) References Cited

U.S. PATENT DOCUMENTS 7,295,827 B2   11/2007   Liu et al.
8,223,021 B2    7/2012   Goodnow et al.
(Continued)

FOREIGN PATENT DOCUMENTS

EP   3242453 A1   11/2017
EP   3146898 B1   11/2018
(Continued)

OTHER PUBLICATIONS

Hanna, J. et al., "Noninvasive, wearable, and tunable electromagnetic multisensing system for continuous glucose monitoring, mimicking vasculature anatomy," Science Advances, 6, eaba5320, 2020 (11 pages).

(Continued)

*Primary Examiner* — Tanmay K Shah
(74) *Attorney, Agent, or Firm* — HSML P.C.

(57) ABSTRACT

Systems for determining a variability in a state of a medium include one or more transmit elements or antennas and one or more receive elements or antennas which are relatively decoupled from one another. The transmit and receive elements or antennas can be less than 95% coupled to one another. The system also includes a transmit circuit configured to generate a transmit signal to be transmitted, which is in a radio or microwave frequency range of the electromagnetic spectrum. The system also includes a receive circuit configured to receive a response detected by the at least one receive antenna resulting from transmission of the transmit signal into the medium. The system includes a processor configured to determine the variability in the state of the medium based on processing of the response over time. The variability can further be used to direct notifications or automated actions.

18 Claims, 12 Drawing Sheets

Related U.S. Application Data

(60) Provisional application No. 63/076,095, filed on Sep. 9, 2020.

(58) Field of Classification Search
USPC .......................................................... 375/267
See application file for complete search history.

(56) References Cited

U.S. PATENT DOCUMENTS

| | | |
|---|---|---|
| 9,198,607 B2 | 12/2015 | Fischer |
| 9,864,024 B2 | 1/2018 | Vester |
| 10,149,629 B2 | 12/2018 | Szczepaniak et al. |
| 10,478,101 B1 | 11/2019 | Cespedes et al. |
| 10,548,503 B2 | 2/2020 | Bosua |
| 10,588,599 B2 | 3/2020 | Weinstein et al. |
| 10,617,296 B2 | 4/2020 | Sloan et al. |
| 10,856,766 B2 | 12/2020 | Leabman |
| 10,912,500 B2 | 2/2021 | Poeze et al. |
| 10,956,950 B2 | 3/2021 | Al-Ali et al. |
| 11,031,970 B1 | 6/2021 | Bosua |
| 11,058,317 B1 | 7/2021 | Bosua |
| 11,063,373 B1 | 7/2021 | Bosua |
| 11,202,582 B2 | 12/2021 | Verkruijsse et al. |
| 11,234,619 B2 | 2/2022 | Bosua |
| 11,244,753 B2 | 2/2022 | Haggerty et al. |
| 11,291,374 B2 | 4/2022 | Lee et al. |
| 11,298,037 B2 | 4/2022 | Leabman |
| 11,350,830 B2 | 6/2022 | McKenna et al. |
| 11,360,188 B2 | 6/2022 | Leabman |
| 11,367,525 B2 | 6/2022 | Addison et al. |
| 11,389,093 B2 | 7/2022 | Triman et al. |
| 11,426,104 B2 | 8/2022 | Schurman et al. |
| 11,689,274 B2 * | 6/2023 | Bosua .................... G01R 33/12 375/267 |
| 2003/0036713 A1 | 2/2003 | Bouton et al. |
| 2004/0065158 A1 | 4/2004 | Schrepfer et al. |
| 2004/0127777 A1 | 7/2004 | Ruchti et al. |
| 2004/0133086 A1 | 7/2004 | Ciurczak et al. |
| 2004/0235536 A1 | 11/2004 | Kim et al. |
| 2009/0275814 A1 | 11/2009 | Watanabe et al. |
| 2010/0041969 A1 | 2/2010 | Beise |
| 2010/0072386 A1 | 3/2010 | Harra et al. |
| 2011/0028814 A1 | 2/2011 | Petersen et al. |
| 2013/0289375 A1 | 10/2013 | Fischer |
| 2014/0213870 A1 | 7/2014 | Hsu et al. |
| 2016/0051171 A1 | 2/2016 | Pikov et al. |
| 2016/0081618 A1 | 3/2016 | Han-Oh et al. |
| 2016/0287151 A1 | 10/2016 | Margaliot |
| 2016/0361002 A1 | 12/2016 | Palikaras et al. |
| 2017/0095667 A1 | 4/2017 | Yakovlev et al. |
| 2017/0181658 A1 | 6/2017 | Dettmann et al. |
| 2017/0248530 A1 | 8/2017 | Parker |
| 2017/0292920 A1 | 10/2017 | Torun et al. |
| 2018/0028824 A1 | 2/2018 | Pivonka et al. |
| 2019/0008422 A1 | 1/2019 | Leath et al. |
| 2019/0053741 A1 | 2/2019 | Chaudhry |
| 2019/0104939 A1 | 4/2019 | Costantine et al. |
| 2019/0269853 A1 | 9/2019 | Doyle et al. |
| 2019/0290161 A1 | 9/2019 | Chase |
| 2019/0353752 A1 | 11/2019 | Lin et al. |
| 2019/0357800 A1 | 11/2019 | Bosua |
| 2019/0388000 A1 | 12/2019 | Costantine et al. |
| 2020/0015708 A1 | 1/2020 | Uplinger, II et al. |
| 2020/0054255 A1 | 2/2020 | Conrad et al. |
| 2020/0057163 A1 | 2/2020 | Bromberg |
| 2020/0146584 A1 | 5/2020 | Bosua |
| 2020/0187791 A1 | 6/2020 | Leabman |
| 2020/0187792 A1 | 6/2020 | Leabman |
| 2020/0187793 A1 | 6/2020 | Leabman |
| 2020/0187812 A1 | 6/2020 | Leabman |
| 2020/0187813 A1 | 6/2020 | Leabman |
| 2020/0187814 A1 | 6/2020 | Leabman |
| 2020/0187815 A1 | 6/2020 | Leabman |
| 2020/0187816 A1 | 6/2020 | Leabman |
| 2020/0187817 A1 | 6/2020 | Leabman |
| 2020/0187818 A1 | 6/2020 | Leabman |
| 2020/0187819 A1 | 6/2020 | Leabman |
| 2020/0187820 A1 | 6/2020 | Leabman |
| 2020/0187836 A1 | 6/2020 | Leabman |
| 2020/0187837 A1 | 6/2020 | Leabman |
| 2020/0187867 A1 | 6/2020 | Leabman |
| 2020/0191909 A1 | 6/2020 | Leabman |
| 2020/0191932 A1 | 6/2020 | Leabman |
| 2020/0191933 A1 | 6/2020 | Leabman |
| 2020/0191944 A1 | 6/2020 | Leabman |
| 2020/0191945 A1 | 6/2020 | Leabman |
| 2020/0191947 A1 | 6/2020 | Leabman |
| 2020/0192426 A1 | 6/2020 | Leabman |
| 2020/0192427 A1 | 6/2020 | Leabman |
| 2020/0192428 A1 | 6/2020 | Leabman |
| 2020/0193326 A1 | 6/2020 | Leabman |
| 2020/0195197 A1 | 6/2020 | Leabman |
| 2020/0195293 A1 | 6/2020 | Leabman |
| 2020/0203012 A1 | 6/2020 | Kamath et al. |
| 2020/0375549 A1 | 12/2020 | Wexler et al. |
| 2021/0186357 A1 | 6/2021 | Bosua et al. |
| 2021/0244308 A1 | 8/2021 | Bosua |
| 2022/0015695 A1 | 1/2022 | Margarito et al. |
| 2022/0031254 A1 | 2/2022 | Al-Ali et al. |
| 2022/0074870 A1 | 3/2022 | Bosua |
| 2022/0074871 A1 | 3/2022 | Bosua |
| 2022/0077602 A1 | 3/2022 | Bosua et al. |
| 2022/0192494 A1 | 6/2022 | Leabman |
| 2022/0192531 A1 | 6/2022 | Leabman |
| 2022/0248984 A1 | 8/2022 | Poeze et al. |
| 2023/0318206 A1 | 10/2023 | Bosua et al. |

FOREIGN PATENT DOCUMENTS

| | | |
|---|---|---|
| EP | 3981329 A1 | 4/2022 |
| JP | 2012125382 | 7/2012 |
| KR | 1020030030839 | 4/2003 |
| KR | 1020090011678 | 2/2009 |
| KR | 1020160081740 | 7/2016 |
| WO | 2017163245 | 9/2017 |
| WO | 2019071138 | 4/2019 |
| WO | 2019198567 | 10/2019 |
| WO | 2019217461 | 11/2019 |
| WO | 2020006077 | 1/2020 |
| WO | 2020037171 | 2/2020 |
| WO | 2021198045 A1 | 10/2021 |
| WO | 2022026623 A1 | 2/2022 |

OTHER PUBLICATIONS

"Contributes to longer healthy life expectancy with non-invasive vital acquisition sensor," Quantum Operation Co., Ltd., presentation found on Jan. 12, 2021 at https://oi.nttdata.com/program/forum/history/20191118/pdf/03_quantum-op.pdf (14 pages including English translation).

International Search Report and Written Opinion for PCT/US2019/031176, mailed Aug. 23, 2019, 9 pages.

Qiang et al., "Quantitative detection of glucose level based on radiofrequency patch biosensor combined with volume-fixed structures," Biosensors and Bioelectronics 98:357-363, 2017.

Shaker, G. et al., "Non-Invasive Monitoring of Glucose Level Changes Utilizing a mm-Wave Radar System," IJMHCI, vol. 10, Issue 3 (2018): pp. 10-29.

Lien, J. et al., "Soli: Ubiquitous Gesture Sensing with Millimeter Wave Radar," ACM Trans. Graph., vol. 35, No. 4, Article 142, 19 pages (Jul. 2016).

International Search Report and Written Opinion issued for International Patent Application No. PCT/IB2020/062222, Date of mailing: Mar. 25, 2021, 7 pages.

International Search Report and Written Opinion issued for International Patent Application No. PCT/IB2021/058175, Date of mailing: Jan. 13, 2022, 11 pages.

* cited by examiner

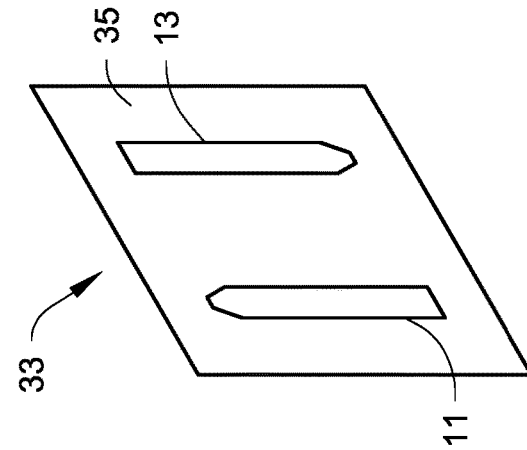
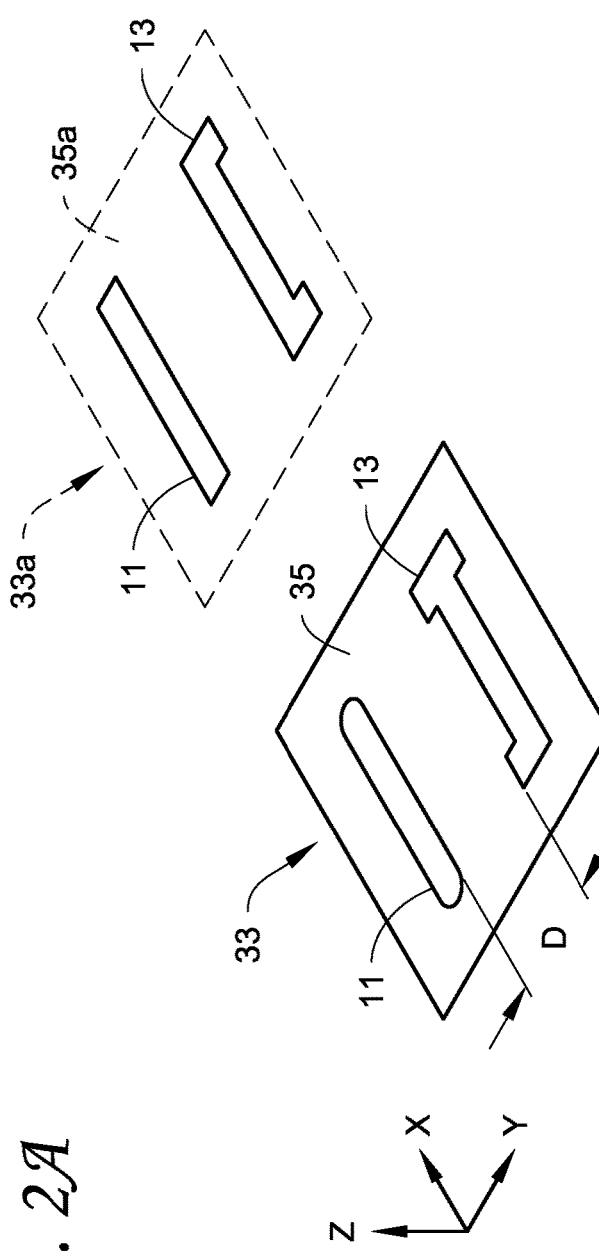
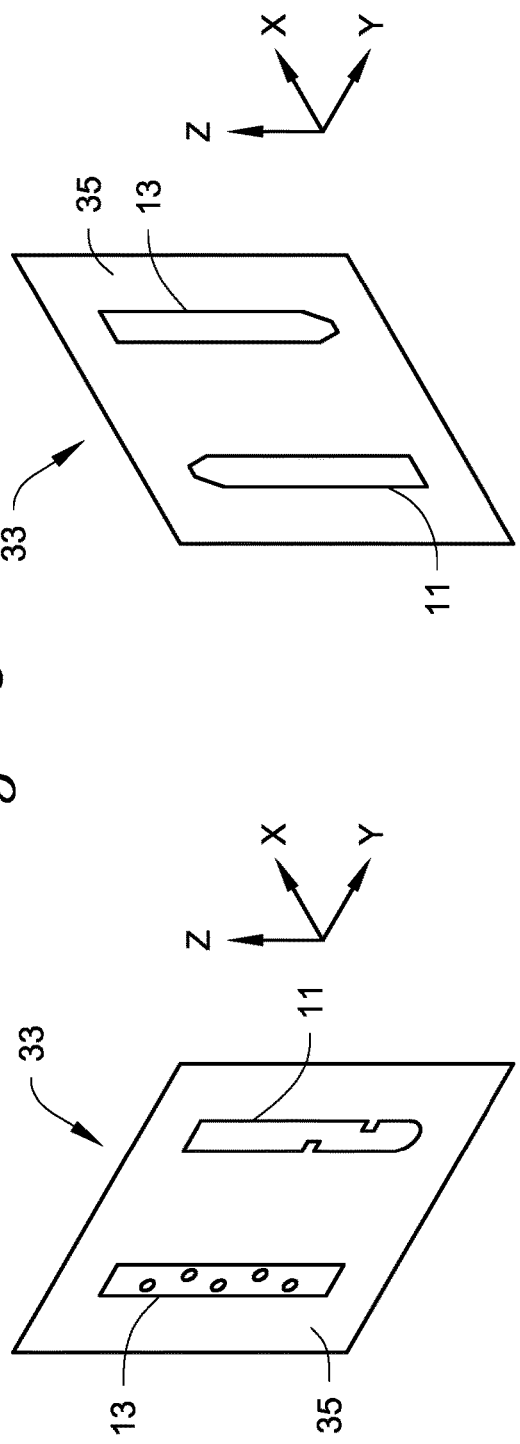

SYSTEMS FOR DETERMINING VARIABILITY IN A STATE OF A MEDIUM

FIELD

This disclosure relates generally to apparatus, systems and methods of determining variability in a state of a medium via spectroscopic techniques using non-optical frequencies such as in the radio or microwave frequency bands of the electromagnetic spectrum.

BACKGROUND

Variability in a state of a medium, such as temperature changes, local temperature variability within the medium, the extent of mixing of multiple compounds in a mixture such as an emulsion or a solution, and the like, can be important parameters for numerous applications, with examples including industrial process controls, medical monitoring, or chemical research, among others. Mixing can frequently be a rate-limiting step in both chemistry research and industrial chemical processes, but ensuring sufficient mixing can be critical to those processes.

SUMMARY

This disclosure relates generally to apparatus, systems and methods for determining variability in a state of a medium via techniques using non-optical frequencies such as in the radio or microwave frequency bands of the electromagnetic spectrum. A sensor described herein includes at least one transmit antenna (which may also be referred to as a transmit element) that functions to transmit a generated transmit signal in a radio or microwave frequency range of the electromagnetic spectrum into a medium being monitored for variability in state, and at least one receive antenna (which may also be referred to as a receive element) that functions to detect a response resulting from transmission of the transmit signal by the transmit antenna into the medium.

The transmit and receive antennas are decoupled from one another which helps to improve the detection capability of the sensor. The decoupling between the transmit and receive antennas can be achieved using any one or more techniques that causes as much of the signal as possible that is transmitted by the transmit antenna to enter the medium and that minimizes or even eliminates the amount of electromagnetic energy that is directly received by the receive antenna from the transmit antenna without traveling into the medium. The decoupling can be achieved by one or more intentionally fabricated configurations and/or arrangements between the transmit and receive antennas that is sufficient to decouple the transmit and receive antennas from one another. In one non-limiting embodiment, the decoupling can be achieved by the transmit antenna and the receive antenna having intentionally different geometries from one another. Intentionally different geometries refers to different geometric configurations of the transmit and receive antennas that are intentional, and is distinct from differences in geometry of transmit and receive antennas that may occur by accident or unintentionally, for example due to manufacturing errors or tolerances.

Another technique to achieve decoupling of the transmit and receive antennas is to use an appropriate spacing between each antenna, depending upon factors such as output power, size of the antennas, frequency, and the presence of any shielding, so as to force a proportion of the electromagnetic lines of force of the transmit signal into the medium so they pass into the medium, thereby minimizing or eliminating as much as possible direct receipt of electromagnetic energy by the receive antenna directly from the transmit antenna without traveling into the medium. This technique helps to ensure that the response detected by the receive antenna is measuring the analyte and is not just the transmitted signal flowing directly from the transmit antenna to the receive antenna. In one embodiment, the sensor can use a first pair of transmit and receive antennas that have a first spacing therebetween, and a second pair of transmit and receive antennas that have a second spacing therebetween that differs from the first spacing.

The techniques described herein can be used to monitor the medium of samples thereof over time and detect variability in a state such as temperature or the composition of a sample, indicating extent of mixing of the medium. The medium can be any suitable medium to be monitored using the sensor, for example human or non-human, animal or non-animal, biological or non-biological. The medium can be a fluid. A sample of the medium, such as a flow from the medium directed through a fluid passage such as a pipe or channel where the medium is a fluid, can be monitored using the sensor to determine variability in the state of the medium as a whole. For example, the medium can include, but is not limited to, human tissue, animal tissue, plant tissue, an inanimate object, soil, a fluid, genetic material, or a microbe.

In an embodiment, a system for determining variability in a state of a medium includes a sensor. The sensor includes an antenna array having at least one transmit antenna and at least one receive antenna. The at least one transmit antenna and the at least one receive antenna are less than 95% coupled to one another. The sensor includes a transmit circuit that is electrically connectable to the at least one transmit antenna, the transmit circuit is configured to generate a transmit signal to be transmitted by the at least one transmit antenna, the transmit signal is in a radio or microwave frequency range of the electromagnetic spectrum. The sensor also includes a receive circuit that is electrically connectable to the at least one receive antenna. The receive circuit is configured to receive a response detected by the at least one receive antenna resulting from transmission of the transmit signal by the at least one transmit antenna into the medium. The system further includes a processor configured to determine the variability in the state of the medium based on processing of the response over time.

In an embodiment, the system further includes a channel configured to convey a flow of the medium past the sensor. In an embodiment, the system further includes a pump configured to drive the flow of the medium through the channel.

In an embodiment, the processor is further configured to provide a notification based on the determined variability in the state of the medium. In an embodiment, the notification is provided when the determined variability in the state of the medium is indicative of the medium being in a steady state condition.

In an embodiment, the processor is further configured to direct an automated action based on the determined variability in the state of the medium. In an embodiment, the automated action is directed when determined variability in the state of the medium is indicative of the medium being in a steady state condition. In an embodiment, the system further includes a mixing device operating on the medium and wherein the automated action includes stopping the mixing device.

In an embodiment, the processing of the response over time includes determining a variability over time of the response received at the receive circuit. In an embodiment, the processor is further configured to determine a detected amount of one or more analytes within the medium based on the response received at the receive circuit, and the processing of the response over time includes determining a variability over time of the detected amount of the one or more analytes within the medium. In an embodiment, the processor is configured to provide an output signal when the medium is in a steady state condition.

In an embodiment, the processor is configured to determine whether the medium is in a steady state condition. In an embodiment, the determination of whether the medium is in a steady state condition includes comparing the variability in the state of the medium to a threshold value.

In an embodiment, a system for determining an extent of mixing of a medium includes a sensor configured to monitor the medium. The sensor includes a sensor housing. The sensor further includes a decoupled detector array attached to the sensor housing. The decoupled detector array has at least one transmit element and at least one receive element, where the at least one transmit element and the at least one receive element are less than 95% coupled to one another. The at least one transmit element consists of a strip of conductive material having at least one lateral dimension thereof greater than a thickness dimension thereof, the strip of conductive material of the at least one transmit element is disposed on a substrate. The at least one receive element consists of a strip of conductive material having at least one lateral dimension thereof greater than a thickness dimension thereof, the strip of conductive material of the at least one receive element is disposed on a substrate. The sensor includes a transmit circuit attached to the sensor housing. The transmit circuit is electrically connectable to the at least one transmit element. The transmit circuit is configured to generate a transmit signal to be transmitted by the at least one transmit element into the medium. The transmit signal is in a radio or microwave frequency range of the electromagnetic spectrum. The sensor further includes a receive circuit attached to the sensor housing. The receive circuit is electrically connectable to the at least one receive element. The receive circuit is configured to receive a response detected by the at least one receive element resulting from transmission of the transmit signal by the at least one transmit element into the medium. The system further includes a processor configured to determine the variability in the state of the medium based on processing of the response over time.

In an embodiment, the system further includes a channel configured to convey a flow of the medium past the sensor. In an embodiment, the system further includes a pump configured to drive the flow of the medium through the channel.

In an embodiment, the processor is further configured to provide a notification based on the determined extent of mixing of the medium. In an embodiment, the notification is provided when the determined extent of mixing of the medium is indicative of the medium being a homogeneous mixture.

In an embodiment, the processor is further configured to direct an automated action based on the determined variability in the state of the medium. In an embodiment, the automated action is directed when determined variability in the state of the medium is indicative of the medium being in a steady state condition. In an embodiment, the system further includes a mixing device operating on the medium and wherein the automated action includes stopping the mixing device.

In an embodiment, the processing of the response over time includes determining a variability over time of the response received at the receive circuit. In an embodiment, the processor is further configured to determine a detected amount of one or more analytes within the medium based on the response received at the receive circuit, and the processing of the response over time includes determining a variability over time of the detected amount of the one or more analytes within the medium.

In an embodiment, the determining of the extent of mixing includes determining whether the medium is a homogeneous mixture. In an embodiment, the determination of whether the medium is homogeneous mixture includes comparing a variability over time of the response received at the receive circuit to a threshold value. In an embodiment, the processor is configured to provide an output signal when the medium is a homogeneous mixture.

In an embodiment, a method for determining variability in a state of a medium includes monitoring the medium. Monitoring the medium includes generating a transmit signal having at least two different frequencies each of which falls within a range of between about 10 kHz to about 100 GHz, transmitting the transmit signal into the medium from at least one transmit element having a first geometry, and using at least one receive element that is decoupled from the at least one transmit element and having a second geometry that is geometrically different from the first geometry to detect a response resulting from transmitting the transmit signal by the at least one transmit element into the medium. The method further includes determining the variability in the state of the medium based on the processing of the response over time based on the response detected at the at least one receive element over time.

In an embodiment, the method further includes directing a flow of the medium past the transmit element and the receive element. In an embodiment, directing the flow of the medium comprises driving the flow of the medium through a channel using a pump.

In an embodiment, the method further includes providing a notification based on the determined variability in the state of the medium. In an embodiment, the notification is provided when the determined variability in the state of the medium indicates that the medium is in a steady state condition.

In an embodiment, the method further includes carrying out an automated action based on the determined variability in the state of the medium. In an embodiment, the automated action is carried out when the determined variability in the state of the medium indicates that the medium is in a steady state condition. In an embodiment, the automated action includes stopping mixing of the medium.

In an embodiment, the determining of the variability in the state of the medium includes measuring an amount of variance in the response over time. In an embodiment, the determining of the variability in the state of the medium includes determining amounts for one or more analytes based on the response, and determining variance of the amounts of the one or more analytes over time.

In an embodiment, the determining of the variability in the state of the medium includes determining whether the medium is in a steady state condition. In an embodiment, the determining of whether the medium is in a steady-state condition includes comparing a variability of the response detected at the at least one receive element over time to a threshold value. In an embodiment, the steady state condition includes at least one of the medium being a homogeneous mixture or the medium being at a constant temperature. In an embodiment, the method further includes providing an output signal indicative of the steady state condition when the medium is in the steady state condition.

In an embodiment, a method for determining an extent of mixing of a medium includes monitoring the medium. Monitoring the medium includes generating a transmit signal having at least two different frequencies each of which falls within a range of between about 10 kHz to about 100 GHz, transmitting the transmit signal from at least one transmit element having a first geometry into the medium; and detecting a response resulting from transmitting the transmit signal by the at least one transmit element into the medium using at least one receive element that is less than 95% coupled to the at least one transmit element. The method further includes determining the extent of mixing of the medium based on the processing of the response over time based on the response detected at the at least one receive element over time.

In an embodiment, the method further includes directing a flow of the medium past the transmit element and the receive element. In an embodiment, directing the flow of the medium comprises driving the flow of the medium through a channel using a pump.

In an embodiment, the method further includes providing a notification based on the determined extent of mixing of the medium. In an embodiment, the notification is provided when the determined variability in the state of the medium indicates that the medium is a homogeneous mixture.

In an embodiment, the method further includes carrying out an automated action based on the determined extent of mixing of the medium. In an embodiment, the automated action is carried out when the determined extent of mixing of the medium indicates that the medium a homogeneous mixture. In an embodiment, the automated action includes stopping mixing of the medium.

In an embodiment, the determining of the extent of mixing of the medium includes measuring an amount of variance in the response over time. In an embodiment, the extent of mixing of the medium includes determining amounts for one or more analytes based on the response, and determining variance of the amounts of the one or more analytes over time.

In an embodiment, the determining of the extent of mixing of the medium includes determining whether the medium is a homogeneous mixture. In an embodiment, the determining whether the medium is the homogeneous mixture includes comparing a variability of the response detected at the at least one receive element over time to a threshold value. In an embodiment, the method further includes providing an output signal indicative of the medium being a homogeneous mixture when the medium is the homogeneous mixture.

DRAWINGS

References are made to the accompanying drawings that form a part of this disclosure, and which illustrate embodiments in which the apparatus, systems and methods described in this specification can be practiced.

FIG. 1 is a schematic depiction of a sensor system monitoring a medium or sample thereof according to an embodiment.

FIGS. 2A-C illustrate different example orientations of antenna arrays that can be used in the sensor system described herein.

Like reference numbers represent like parts throughout.

DETAILED DESCRIPTION

Figure 1:
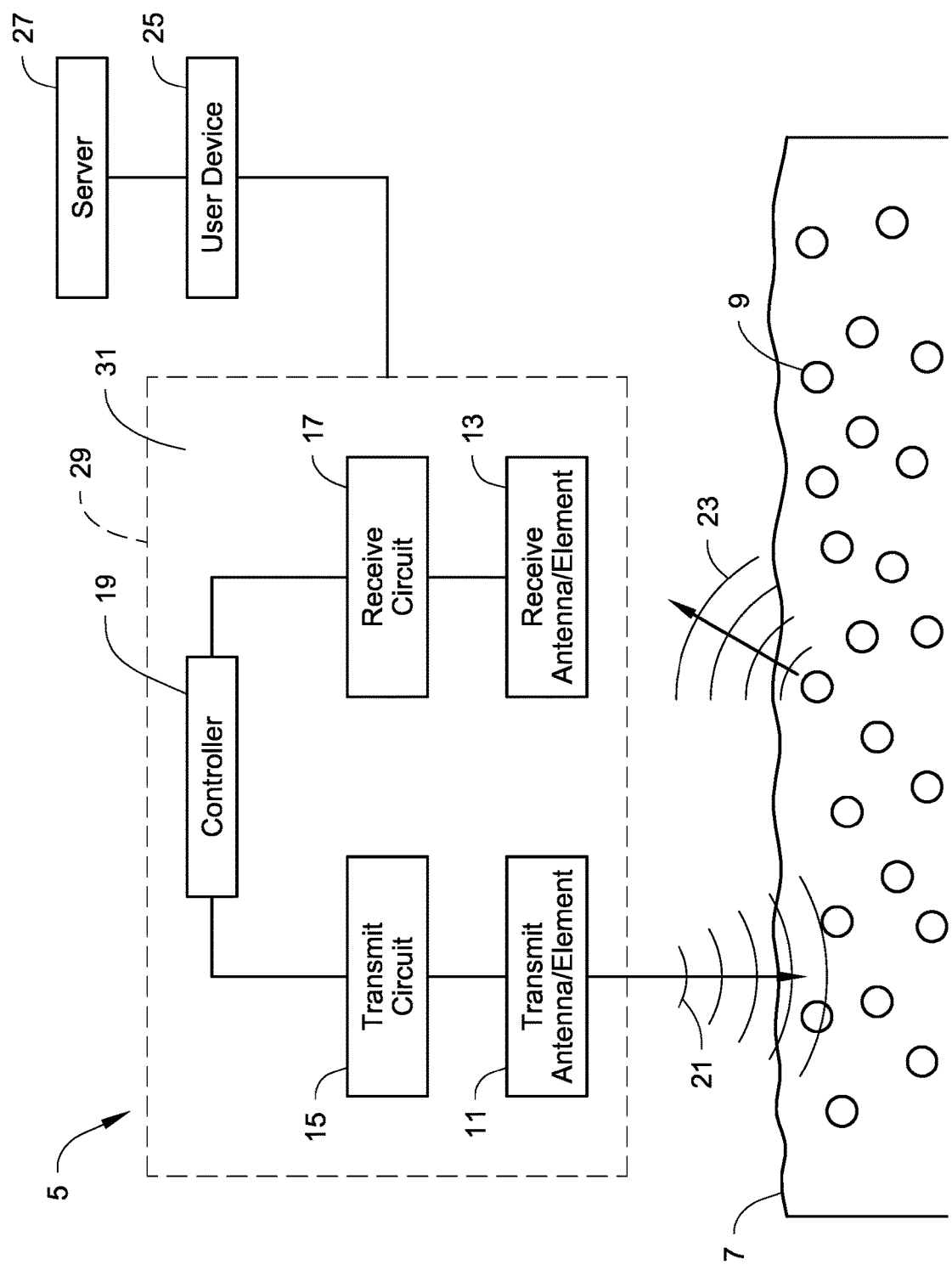

The following is a detailed description of apparatus, systems and methods of determining variability in a state of a medium using spectroscopic techniques using non-optical frequencies such as in the radio or microwave frequency bands of the electromagnetic spectrum. A sensor includes a transmit antenna (which may also be referred to as a transmit element) that functions to transmit a generated transmit signal that is in a radio or microwave frequency range of the electromagnetic spectrum into the medium or a sample thereof, and a receive antenna (which may also be referred to as a receive element) that functions to detect a response resulting from transmission of the transmit signal by the transmit antenna into the medium or sample thereof. The transmit antenna and the receive antenna are decoupled from one another which improves the detection performance of the sensor.

The transmit antenna and the receive antenna can be located near the medium or sample thereof. The transmit antenna transmits a signal, which has at least two frequencies in the radio or microwave frequency range, toward and into the medium or sample thereof. The signal with the at least two frequencies can be formed by separate signal portions, each having a discrete frequency, that are transmitted separately at separate times at each frequency. In another embodiment, the signal with the at least two frequencies may be part of a complex signal that includes a plurality of frequencies including the at least two frequencies. The complex signal can be generated by blending or multiplexing multiple signals together followed by transmitting the complex signal whereby the plurality of frequencies are transmitted at the same time. One possible technique for generating the complex signal includes, but is not limited to, using an inverse Fourier transformation technique. The receive antenna detects a response resulting from transmission of the signal by the transmit antenna into the medium or sample thereof. The response can be monitored over time and processed to determine variability in a state, such as temperature, volume, phase, density, or composition of the medium, for example to indicate an extent of mixing or separation of the medium. In an embodiment, the response can be processed to determine the presence or amount of one or more analytes in the medium or sample thereof, as part of or in addition to the processing to determine the variability in the state of the medium. For example, the relative change in the amounts of one or more analytes of interest can be used to determine mixing of the one or more analytes in the medium.

The transmit antenna and the receive antenna are decoupled (which may also be referred to as detuned or the like) from one another. Decoupling refers to intentionally fabricating the configuration and/or arrangement of the transmit antenna and the receive antenna to minimize direct communication between the transmit antenna and the receive antenna, preferably absent shielding. Shielding between the transmit antenna and the receive antenna can be utilized. However, the transmit antenna and the receive antenna are decoupled even without the presence of shielding.

The signal(s) detected by the receive antenna can be monitored over time, for example signals can be compared at discrete sample times or changes over time in continuous measurements can be tracked, to determine variability in the signal(s) over time. In an embodiment, time-separated response signals can be compared to one another to determine variability over time. In an embodiment, each of the time-separated response signals can be processed to determine amounts of one or more analytes.

The signal(s) detected by the receive antenna can also be analyzed to detect one or more analyte based on the intensity of the received signal(s) and reductions in intensity at one or more frequencies where an analyte absorbs the transmitted signal. An example of detecting an analyte using a non-invasive spectroscopy sensor operating in the radio or microwave frequency range of the electromagnetic spectrum is described in WO 2019/217461, the entire contents of which are incorporated herein by reference. The signal(s) detected by the receive antenna can be complex signals including a plurality of signal components, each signal component being at a different frequency. In an embodiment, the detected complex signals can be decomposed into the signal components at each of the different frequencies, for example through a Fourier transformation. In an embodiment, the complex signal detected by the receive antenna can be analyzed as a whole (i.e. without demultiplexing the complex signal). In addition, the signal(s) detected by the receive antenna can be separate signal portions, each having a discrete frequency.

In one embodiment, the sensor described herein can be used to detect the presence of at least one analyte in the medium or sample thereof. In another embodiment, the sensor described herein can detect an amount or a concentration of the at least one analyte in the medium or sample thereof. The medium or sample thereof can be any material containing at least one analyte of interest that one may wish to detect or state such as temperature or extent of mixing to be monitored. The target can be human or non-human, animal or non-animal, biological or non-biological. For example, the medium or sample thereof can include, but is not limited to, human tissue, animal tissue, plant tissue, an inanimate object, soil, a fluid, genetic material, or a microbe. Non-limiting examples of targets include, but are not limited to, a fluid, for example blood, interstitial fluid, cerebral spinal fluid, lymph fluid or urine, human tissue, animal tissue, plant tissue, an inanimate object, soil, genetic material, or a microbe. In an embodiment, a sample of a medium is monitored using the sensor. The sample can be a flow of a portion of the medium, for example a flow directed from the medium, through fluid passage such as a pipe or channel, past the sensor, and returning to the medium. In an embodiment, a pump can drive the sample through the fluid passage.

In embodiments including detection of at least one analyte, the analyte(s) can be any analyte that one may wish to detect. The analyte can be human or non-human, animal or non-animal, biological or non-biological. For example, the analyte(s) can include, but is not limited to, one or more of blood glucose, blood alcohol, white blood cells, or luteinizing hormone. The analyte(s) can include, but is not limited to, a chemical, a combination of chemicals, a virus, bacteria, or the like. The analyte can be a chemical included in another medium, with non-limiting examples of such media including a fluid containing the at least one analyte, for example blood, interstitial fluid, cerebral spinal fluid, lymph fluid or urine, human tissue, animal tissue, plant tissue, an inanimate object, soil, genetic material, or a microbe. The analyte(s) may also be a non-human, non-biological particle such as a mineral or a contaminant.

The analyte(s) can include, for example, naturally occurring substances, artificial substances, metabolites, and/or reaction products. As non-limiting examples, the at least one analyte can include, but is not limited to, insulin, acarboxyprothrombin; acylcarnitine; adenine phosphoribosyl transferase; adenosine deaminase; albumin; alpha-fetoprotein; amino acid profiles (arginine (Krebs cycle), histidine/urocanic acid, homocysteine, phenylalanine/tyrosine, tryptophan); andrenostenedione; antipyrine; arabinitol enantiomers; arginase; benzoylecgonine (cocaine); biotinidase; biopterin; c-reactive protein; carnitine; pro-BNP; BNP; troponin; carnosinase; CD4; ceruloplasmin; chenodeoxycholic acid; chloroquine; cholesterol; cholinesterase; conjugated 1-β hydroxy-cholic acid; cortisol; creatine kinase; creatine kinase MM isoenzyme; cyclosporin A; d-penicillamine; de-ethylchloroquine; dehydroepiandrosterone sulfate; DNA (for example, DNA associated with acetylator polymorphism, alcohol dehydrogenase, alpha 1-antitrypsin, cystic fibrosis, Duchenne/Becker muscular dystrophy, analyte-6-phosphate dehydrogenase, hemoglobin A, hemoglobin S, hemoglobin C, hemoglobin D, hemoglobin E, hemoglobin F, D-Punjab, beta-thalassemia, hepatitis B virus, HCMV, HIV-1, HTLV-1, Leber hereditary optic neuropathy, MCAD, RNA, PKU, *Plasmodium vivax*, sexual differentiation, or 21-deoxycortisol); desbutylhalofantrine; dihydropteridine reductase; diptheria/tetanus antitoxin; erythrocyte arginase; erythrocyte protoporphyrin; esterase D; fatty acids/acylglycines; free β-human chorionic gonadotropin; free erythrocyte porphyrin; free thyroxine (FT4); free tri-iodothyronine (FT3); fumarylacetoacetase; galactose/gal-1-phosphate; galactose-1-phosphate uridyltransferase; gentamicin; analyte-6-phosphate dehydrogenase; glutathione; glutathione perioxidase; glycocholic acid; glycosylated hemoglobin; halofantrine; hemoglobin variants; hexosaminidase A; human erythrocyte carbonic anhydrase I; 17-alpha-hydroxy-progesterone; hypoxanthine phosphoribosyl transferase; immunoreactive trypsin; lactate; lead; lipoproteins ((a), B/A−1, β); lysozyme; mefloquine; netilmicin; phenobarbitone; phenytoin; phytanic/pristanic acid; progesterone; prolactin; prolidase; purine nucleoside phosphorylase; quinine; reverse tri-iodothyronine (rT3); selenium; serum pancreatic lipase; sissomicin; somatomedin C; specific antibodies (adenovirus, anti-nuclear antibody, anti-zeta antibody, arbovirus, Aujeszky's disease virus, dengue virus, *Dracunculus medinensis*, *Echinococcus granulosus*, *Entamoeba histolytica*, enterovirus, *Giardia duodenalisa*, *Helicobacter pylori*, hepatitis B virus, herpes virus, HIV-1, IgE (atopic disease), influenza virus, *Leishmania donovani*, leptospira, measles/mumps/rubella, *Mycobacterium leprae*, *Mycoplasma pneumoniae*, Myoglobin, *Onchocerca volvulus*, parainfluenza virus, *Plasmodium falciparum*, polio virus, *Pseudomonas aeruginosa*, respiratory syncytial virus, *rickettsia* (scrub typhus), *Schistosoma mansoni, Toxoplasma gondii, Trepenoma pallidium, Trypanosoma cruzi*/rangeli, vesicular *stomatis* virus, *Wuchereria bancrofti*, yellow fever virus); specific antigens (hepatitis B virus, HIV-1); succinylacetone; sulfadoxine; theophylline; thyrotropin (TSH); thyroxine (T4); thyroxine-binding globulin; trace elements; transferrin; UDP-galactose-4-epimerase; urea; uroporphyrinogen I synthase; vitamin A; white blood cells; and zinc protoporphyrin.

The analyte(s) can also include one or more chemicals introduced into the target. The analyte(s) can include a marker such as a contrast agent, a radioisotope, or other chemical agent. The analyte(s) can include a fluorocarbon-based synthetic blood. The analyte(s) can include a drug or pharmaceutical composition, with non-limiting examples including ethanol; cannabis (marijuana, tetrahydrocannabinol, hashish); inhalants (nitrous oxide, amyl nitrite, butyl nitrite, chlorohydrocarbons, hydrocarbons); cocaine (crack cocaine); stimulants (amphetamines, methamphetamines, Ritalin, Cylert, Preludin, Didrex, PreState, Voranil, Sandrex, Plegine); depressants (barbiturates, methaqualone, tranquilizers such as Valium, Librium, Miltown, Serax, Equanil, Tranxene); hallucinogens (phencyclidine, lysergic acid, mescaline, peyote, psilocybin); narcotics (heroin, codeine, morphine, opium, meperidine, Percocet, Percodan, Tussionex, Fentanyl, Darvon, Talwin, Lomotil); designer drugs (analogs of fentanyl, meperidine, amphetamines, methamphetamines, and phencyclidine, for example, Ecstasy); anabolic steroids; and nicotine. The analyte(s) can include other drugs or pharmaceutical compositions. The analyte(s) can include neurochemicals or other chemicals generated within the body, such as, for example, ascorbic acid, uric acid, dopamine, noradrenaline, 3-methoxytyramine (3MT), 3,4-Dihydroxyphenylacetic acid (DOPAC), Homovanillic acid (HVA), 5-Hydroxytryptamine (5HT), and 5-Hydroxyindoleacetic acid (FHIAA).

FIG. 1 is a schematic depiction of a sensor system monitoring a medium or sample thereof 7 according to an embodiment. The sensor 5 is depicted relative to a medium or sample thereof 7. In the embodiment shown in FIG. 1, the medium or sample thereof 7 can contain an analyte 9. In this example, the sensor 5 is depicted as including an antenna array that includes a transmit antenna/element 11 (hereinafter "transmit antenna 11") and a receive antenna/element 13 (hereinafter "receive antenna 13"). The sensor 5 further includes a transmit circuit 15, a receive circuit 17, and a controller 19. As discussed further below, the sensor 5 can also include a power supply, such as a battery (not shown in FIG. 1).

The transmit antenna 11 is positioned, arranged and configured to transmit a signal 21 that is the radio frequency (RF) or microwave range of the electromagnetic spectrum into the medium or sample thereof 7. The transmit antenna 11 can be an electrode or any other suitable transmitter of electromagnetic signals in the radio frequency (RF) or microwave range. The transmit antenna 11 can have any arrangement and orientation relative to the medium or sample thereof 7 that is sufficient to allow the sensor 5 to monitor the medium or sample thereof. In one non-limiting embodiment, the transmit antenna 11 can be arranged to face in a direction that is substantially toward the medium or sample thereof 7.

The signal 21 transmitted by the transmit antenna 11 is generated by the transmit circuit 15 which is electrically connectable to the transmit antenna 11. The transmit circuit 15 can have any configuration that is suitable to generate a transmit signal to be transmitted by the transmit antenna 11. Transmit circuits for generating transmit signals in the RF or microwave frequency range are well known in the art. In one embodiment, the transmit circuit 15 can include, for example, a connection to a power source, a frequency generator, and optionally filters, amplifiers or any other suitable elements for a circuit generating an RF or microwave frequency electromagnetic signal. In an embodiment, the signal generated by the transmit circuit 15 can have at least two discrete frequencies (i.e. a plurality of discrete frequencies), each of which is in the range from about 10 kHz to about 100 GHz. In another embodiment, each of the at least two discrete frequencies can be in a range from about 300 MHz to about 6000 MHz. In an embodiment, the transmit circuit 15 can be configured to sweep through a range of frequencies that are within the range of about 10 kHz to about 100 GHz, or in another embodiment a range of about 300 MHz to about 6000 MHz. In an embodiment, the transmit circuit 15 can be configured to produce a complex transmit signal, the complex signal including a plurality of signal components, each of the signal components having a different frequency. The complex signal can be generated by blending or multiplexing multiple signals together followed by transmitting the complex signal whereby the plurality of frequencies are transmitted at the same time.

The receive antenna 13 is positioned, arranged, and configured to detect one or more electromagnetic response signals 23 that result from the transmission of the transmit signal 21 by the transmit antenna 11 into the medium or sample thereof 7 and impinging on material therein, which may include an analyte 9. The receive antenna 13 can be an electrode or any other suitable receiver of electromagnetic signals in the radio frequency (RF) or microwave range. In an embodiment, the receive antenna 13 is configured to detect electromagnetic signals having at least two frequencies, each of which is in the range from about 10 kHz to about 100 GHz, or in another embodiment a range from about 300 MHz to about 6000 MHz. The receive antenna 13 can have any arrangement and orientation relative to the medium or sample thereof 7 that is sufficient to allow detection of the response signal(s) 23 to allow monitoring of the medium or sample thereof. In one non-limiting embodiment, the receive antenna 13 can be arranged to face in a direction that is substantially toward the medium or sample thereof 7.

The receive circuit 17 is electrically connectable to the receive antenna 13 and conveys the received response from the receive antenna 13 to the controller 19. The receive circuit 17 can have any configuration that is suitable for interfacing with the receive antenna 13 to convert the electromagnetic energy detected by the receive antenna 13 into one or more signals reflective of the response signal(s) 23. The construction of receive circuits are well known in the art. The receive circuit 17 can be configured to condition the signal(s) prior to providing the signal(s) to the controller 19, for example through amplifying the signal(s), filtering the signal(s), or the like. Accordingly, the receive circuit 17 may include filters, amplifiers, or any other suitable components for conditioning the signal(s) provided to the controller 19. In an embodiment, at least one of the receive circuit 17 or the controller 19 can be configured to decompose or demultiplex a complex signal, detected by the receive antenna 13, including a plurality of signal components each at different frequencies into each of the constituent signal components. In an embodiment, decomposing the complex signal can include applying a Fourier transform to the detected complex signal. However, decomposing or demultiplexing a received complex signal is optional. Instead, in an embodiment, the complex signal detected by the receive antenna can be analyzed as a whole (i.e. without demultiplexing the complex signal) to observe changes over time and determine variability in a state of the medium or sample thereof 7.

The controller 19 controls the operation of the sensor 5. The controller 19, for example, can direct the transmit circuit 15 to generate a transmit signal to be transmitted by the transmit antenna 11. The controller 19 further receives signals from the receive circuit 17. The controller 19 can optionally process the signals from the receive circuit 17 to determine variability over time of those signals, and/or to detect the analyte(s) 9 in the medium or sample thereof 7. In one embodiment, the controller 19 may optionally be in communication with at least one external device 25 such as a user device and/or a remote server 27, for example through one or more wireless connections such as Bluetooth, wireless data connections such a 4G, 5G, LTE or the like, or Wi-Fi. If provided, the external device 25 and/or remote server 27 may process (or further process) the signals that the controller 19 receives from the receive circuit 17, for example to process the signals over time to determine variability in a state of the medium or sample thereof 7. If provided, the external device 25 may be used to provide communication between the sensor 5 and the remote server 27, for example using a wired data connection or via a wireless data connection or Wi-Fi of the external device 25 to provide the connection to the remote server 27.

The sensor 5 can further include or be incorporated into a device including notification device 20 configured to provide a human perceptible notification. Notification device 20 can include one or more components for providing the human perceptible notification including, as non-limiting examples, a speaker to provide an audible notification, vibrating components to provide a tactile notification, and/or a light or a display to provide a visual notification. In an embodiment, the sensor 5 can direct presentation of the notification based on the variability in the state of medium or sample thereof 7 and notification criteria. In an embodiment, the sensor 5 or device that sensor 5 is incorporated into can be directed to present the notification by external device 25 or remote server 27. In an embodiment, the sensor 5 includes a processor configured to determine a notification to be presented and send an instruction directing presentation of the notification to be presented. In an embodiment, controller 19 of sensor 5 can be configured to determine a notification to present and send an instruction directing presentation of the notification.

The external device 25 can be, as non-limiting examples, a mobile phone (a.k.a. cell phone, smartphone); a tablet computer; a laptop computer; a personal computer; a wearable device such as a watch or a head-mounted device or clothing; a video game console; furniture such as a chair; a vehicle such as a car, automobile or truck; lightbulbs; smart home appliances such as a smart refrigerator; and a use specific device similar to these devices that is specifically designed to function with the sensor 5. In an embodiment, the external device 25 can present a notification. In an embodiment, presentation of a notification is determined at the external device 25 based on notification criteria and variability in the state of the medium or sample thereof 7 that is detected. In an embodiment, the external device 25 can direct the sensor 5 to provide the notification. In an embodiment, the external device 25 can be directed to provide the notification by sensor 5 or remote server 27. The external device 25 can include a notification device 30 configured to provide a human perceptible notification. Notification device 30 can include one or more components for providing the human perceptible notification including, as non-limiting examples, a speaker to provide an audible notification, vibrating components to provide a tactile notification, and/or a light or a display to provide a visual notification. In an embodiment, the external device 25 includes a processor 26 configured to determine a notification to present and send an instruction directing presentation of the notification.

The remote server 27 can be configured to determine presentation of a notification based on the variability in the state of the medium such as achieving a steady state condition such as holding at a particular temperature or a mixture being homogeneous, for example using notification criteria as described below. The remote server 27 can direct one or both of the sensor 5 or external device 25 to present the notification, for example by sending a command or other such message through the connection linking remote server 27 to sensor 5 or external device 25. In an embodiment, the remote server 27 includes a processor 28 configured to determine a notification to present and send an instruction directing presentation of the notification.

With continued reference to FIG. 1, the sensor 5 may include a sensor housing 29 (shown in dashed lines) that defines an interior space 31. Components of the sensor 5 may be attached to and/or disposed within the housing 29. For example, the transmit antenna 11 and the receive antenna 13 are attached to the housing 29. In some embodiments, the antennas 11, 13 may be entirely or partially within the interior space 31 of the housing 29. In some embodiments, the antennas 11, 13 may be attached to the housing 29 but at least partially or fully located outside the interior space 31. In some embodiments, the transmit circuit 15, the receive circuit 17 and the controller 19 are attached to the housing 29 and disposed entirely within the sensor housing 29. In some embodiments, sensor housing 29 can be fixed to a fluid channel such as a pipe or channel (not shown) through which a sample of a medium 7 passes.

The receive antenna 13 is decoupled or detuned with respect to the transmit antenna 11 such that electromagnetic coupling between the transmit antenna 11 and the receive antenna 13 is reduced. The decoupling of the transmit antenna 11 and the receive antenna 13 increases the portion of the signal(s) detected by the receive antenna 13 that is the response signal(s) 23 from the target 7, and minimizes direct receipt of the transmitted signal 21 by the receive antenna 13. The decoupling of the transmit antenna 11 and the receive antenna 13 results in transmission from the transmit antenna 11 to the receive antenna 13 having a reduced forward gain ($S_{21}$) and an increased reflection at output ($S_{22}$) compared to antenna systems having coupled transmit and receive antennas.

In an embodiment, coupling between the transmit antenna 11 and the receive antenna 13 is 95% or less. In another embodiment, coupling between the transmit antenna 11 and the receive antenna 13 is 90% or less. In another embodiment, coupling between the transmit antenna 11 and the receive antenna 13 is 85% or less. In another embodiment, coupling between the transmit antenna 11 and the receive antenna 13 is 75% or less.

Any technique for reducing coupling between the transmit antenna 11 and the receive antenna 13 can be used. For example, the decoupling between the transmit antenna 11 and the receive antenna 13 can be achieved by one or more intentionally fabricated configurations and/or arrangements between the transmit antenna 11 and the receive antenna 13 that is sufficient to decouple the transmit antenna 11 and the receive antenna 13 from one another.

For example, in one embodiment described further below, the decoupling of the transmit antenna 11 and the receive antenna 13 can be achieved by intentionally configuring the transmit antenna 11 and the receive antenna 13 to have different geometries from one another. Intentionally different geometries refers to different geometric configurations of the transmit and receive antennas 11, 13 that are intentional. Intentional differences in geometry are distinct from differences in geometry of transmit and receive antennas that may occur by accident or unintentionally, for example due to manufacturing errors or tolerances.

Another technique to achieve decoupling of the transmit antenna 11 and the receive antenna 13 is to provide appropriate spacing between each antenna 11, 13 that is sufficient to decouple the antennas 11, 13 and force a proportion of the electromagnetic lines of force of the transmitted signal 21 into the target 7 thereby minimizing or eliminating as much as possible direct receipt of electromagnetic energy by the receive antenna 13 directly from the transmit antenna 11 without traveling into the target 7. The appropriate spacing between each antenna 11, 13 can be determined based upon factors that include, but are not limited to, the output power of the signal from the transmit antenna 11, the size of the antennas 11, 13, the frequency or frequencies of the transmitted signal, and the presence of any shielding between the antennas. This technique helps to ensure that the response detected by the receive antenna 13 is from material in the medium or sample thereof 7 and is not just the transmitted signal 21 flowing directly from the transmit antenna 11 to the receive antenna 13. In some embodiments, the appropriate spacing between the antennas 11, 13 can be used together with the intentional difference in geometries of the antennas 11, 13 to achieve decoupling.

In one embodiment, the transmit signal that is transmitted by the transmit antenna 11 can have at least two different frequencies, for example upwards of 7 to 12 different and discrete frequencies. In another embodiment, the transmit signal can be a series of discrete, separate signals with each separate signal having a single frequency or multiple different frequencies.

In one embodiment, the transmit signal (or each of the transmit signals) can be transmitted over a transmit time that is less than, equal to, or greater than about 300 ms. In another embodiment, the transmit time can be than, equal to, or greater than about 200 ms. In still another embodiment, the transmit time can be less than, equal to, or greater than about 30 ms. The transmit time could also have a magnitude that is measured in seconds, for example 1 second, 5 seconds, 10 seconds, or more. In an embodiment, the same transmit signal can be transmitted multiple times, and then the transmit time can be averaged. In another embodiment, the transmit signal (or each of the transmit signals) can be transmitted with a duty cycle that is less than or equal to about 50%.

FIGS. 2A-2C illustrate examples of antenna arrays 33 that can be used in the sensor system 5 and how the antenna arrays 33 can be oriented. Many orientations of the antenna arrays 33 are possible, and any orientation can be used as long as the sensor 5 can perform its primary function of detecting variability in a state of medium or sample thereof 7.

In FIG. 2A, the antenna array 33 includes the transmit antenna 11 and the receive antenna 13 disposed on a substrate 35 which may be substantially planar. This example depicts the array 33 disposed substantially in an X-Y plane. In this example, dimensions of the antennas 11, 13 in the X and Y-axis directions can be considered lateral dimensions, while a dimension of the antennas 11, 13 in the Z-axis direction can be considered a thickness dimension. In this example, each of the antennas 11, 13 has at least one lateral dimension (measured in the X-axis direction and/or in the Y-axis direction) that is greater than the thickness dimension thereof (in the Z-axis direction). In other words, the transmit antenna 11 and the receive antenna 13 are each relatively flat or of relatively small thickness in the Z-axis direction compared to at least one other lateral dimension measured in the X-axis direction and/or in the Y-axis direction.

In use of the embodiment in FIG. 2A, the sensor and the array 33 may be positioned relative to the medium or sample thereof 7 such that the medium or sample thereof 7 is below the array 33 in the Z-axis direction or above the array 33 in the Z-axis direction whereby one of the faces of the antennas 11, 13 face toward the medium or sample thereof 7. Alternatively, the medium or sample thereof 7 can be positioned to the left or right sides of the array 33 in the X-axis direction whereby one of the ends of each one of the antennas 11, 13 face toward the medium or sample thereof 7. Alternatively, the medium or sample thereof 7 can be positioned to the sides of the array 33 in the Y-axis direction whereby one of the sides of each one of the antennas 11, 13 face toward the medium or sample thereof 7.

The sensor 5 can also be provided with one or more additional antenna arrays in addition the antenna array 33. For example, FIG. 2A also depicts an optional second antenna array 33a that includes the transmit antenna 11 and the receive antenna 13 disposed on a substrate 35a which may be substantially planar. Like the array 33, the array 33a may also be disposed substantially in the X-Y plane, with the arrays 33, 33a spaced from one another in the X-axis direction.

In FIG. 2B, the antenna array 33 is depicted as being disposed substantially in the Y-Z plane. In this example, dimensions of the antennas 11, 13 in the Y and Z-axis directions can be considered lateral dimensions, while a dimension of the antennas 11, 13 in the X-axis direction can be considered a thickness dimension. In this example, each of the antennas 11, 13 has at least one lateral dimension (measured in the Y-axis direction and/or in the Z-axis direction) that is greater than the thickness dimension thereof (in the X-axis direction). In other words, the transmit antenna 11 and the receive antenna 13 are each relatively flat or of relatively small thickness in the X-axis direction compared to at least one other lateral dimension measured in the Y-axis direction and/or in the Z-axis direction.

In use of the embodiment in FIG. 2B, the sensor and the array 33 may be positioned relative to the medium or sample thereof 7 such that the medium or sample thereof 7 is below the array 33 in the Z-axis direction or above the array 33 in the Z-axis direction whereby one of the ends of each one of the antennas 11, 13 face toward the medium or sample thereof 7. Alternatively, the medium or sample thereof 7 can be positioned in front of or behind the array 33 in the X-axis direction whereby one of the faces of each one of the antennas 11, 13 face toward the medium or sample thereof 7. Alternatively, the medium or sample thereof 7 can be positioned to one of the sides of the array 33 in the Y-axis direction whereby one of the sides of each one of the antennas 11, 13 face toward the medium or sample thereof 7.

In FIG. 2C, the antenna array 33 is depicted as being disposed substantially in the X-Z plane. In this example, dimensions of the antennas 11, 13 in the X and Z-axis directions can be considered lateral dimensions, while a dimension of the antennas 11, 13 in the Y-axis direction can be considered a thickness dimension. In this example, each of the antennas 11, 13 has at least one lateral dimension (measured in the X-axis direction and/or in the Z-axis direction) that is greater than the thickness dimension thereof (in the Y-axis direction). In other words, the transmit antenna 11 and the receive antenna 13 are each relatively flat or of relatively small thickness in the Y-axis direction compared to at least one other lateral dimension measured in the X-axis direction and/or in the Z-axis direction.

In use of the embodiment in FIG. 2C, the sensor and the array 33 may be positioned relative to the medium or sample thereof 7 such that the medium or sample thereof 7 is below the array 33 in the Z-axis direction or above the array 33 in the Z-axis direction whereby one of the ends of each one of the antennas 11, 13 face toward the medium or sample thereof 7. Alternatively, the medium or sample thereof 7 can be positioned to the left or right sides of the array 33 in the X-axis direction whereby one of the sides of each one of the antennas 11, 13 face toward the medium or sample thereof 7. Alternatively, the medium or sample thereof 7 can be positioned in front of or in back of the array 33 in the Y-axis direction whereby one of the faces of each one of the antennas 11, 13 face toward the medium or sample thereof 7.

The arrays 33, 33a in FIGS. 2A-2C need not be oriented entirely within a plane such as the X-Y plane, the Y-Z plane or the X-Z plane. Instead, the arrays 33, 33a can be disposed at angles to the X-Y plane, the Y-Z plane and the X-Z plane.

Decoupling Antennas Using Differences in Antenna Geometries

As mentioned above, one technique for decoupling the transmit antenna 11 from the receive antenna 13 is to intentionally configure the transmit antenna 11 and the receive antenna 13 to have intentionally different geometries. Intentionally different geometries refers to differences in geometric configurations of the transmit and receive antennas 11, 13 that are intentional, and is distinct from differences in geometry of the transmit and receive antennas 11, 13 that may occur by accident or unintentionally, for example due to manufacturing errors or tolerances when fabricating the antennas 11, 13.

The different geometries of the antennas 11, 13 may manifest itself, and may be described, in a number of different ways. For example, in a plan view of each of the antennas 11, 13 (such as in FIGS. 3A-I), the shapes of the perimeter edges of the antennas 11, 13 may be different from one another. The different geometries may result in the antennas 11, 13 having different surface areas in plan view. The different geometries may result in the antennas 11, 13 having different aspect ratios in plan view (i.e. a ratio of their sizes in different dimensions; for example, as discussed in further detail below, the ratio of the length divided by the width of the antenna 11 may be different than the ratio of the length divided by the width for the antenna 13). In some embodiments, the different geometries may result in the antennas 11, 13 having any combination of different perimeter edge shapes in plan view, different surface areas in plan view, and/or different aspect ratios. In some embodiments, the antennas 11, 13 may have one or more holes formed therein (see FIG. 2B) within the perimeter edge boundary, or one or more notches formed in the perimeter edge (see FIG. 2B).

So as used herein, a difference in geometry or a difference in geometrical shape of the antennas 11, 13 refers to any intentional difference in the figure, length, width, size, shape, area closed by a boundary (i.e. the perimeter edge), etc. when the respective antenna 11, 13 is viewed in a plan view.

The antennas 11, 13 can have any configuration and can be formed from any suitable material that allows them to perform the functions of the antennas 11, 13 as described herein. In one embodiment, the antennas 11, 13 can be formed by strips of material. A strip of material can include a configuration where the strip has at least one lateral dimension thereof greater than a thickness dimension thereof when the antenna is viewed in a plan view (in other words, the strip is relatively flat or of relatively small thickness compared to at least one other lateral dimension, such as length or width when the antenna is viewed in a plan view as in FIGS. 3A-I). A strip of material can include a wire. The antennas 11, 13 can be formed from any suitable conductive material(s) including metals and conductive non-metallic materials. Examples of metals that can be used include, but are not limited to, copper or gold. Another example of a material that can be used is non-metallic materials that are doped with metallic material to make the non-metallic material conductive.

In FIGS. 2A-2C, the antennas 11, 13 within each one of the arrays 33, 33a have different geometries from one another. In addition, FIGS. 3A-I illustrate plan views of additional examples of the antennas 11, 13 having different geometries from one another. The examples in FIGS. 2A-2C and 3A-I are not exhaustive and many different configurations are possible.

Figure 3A:
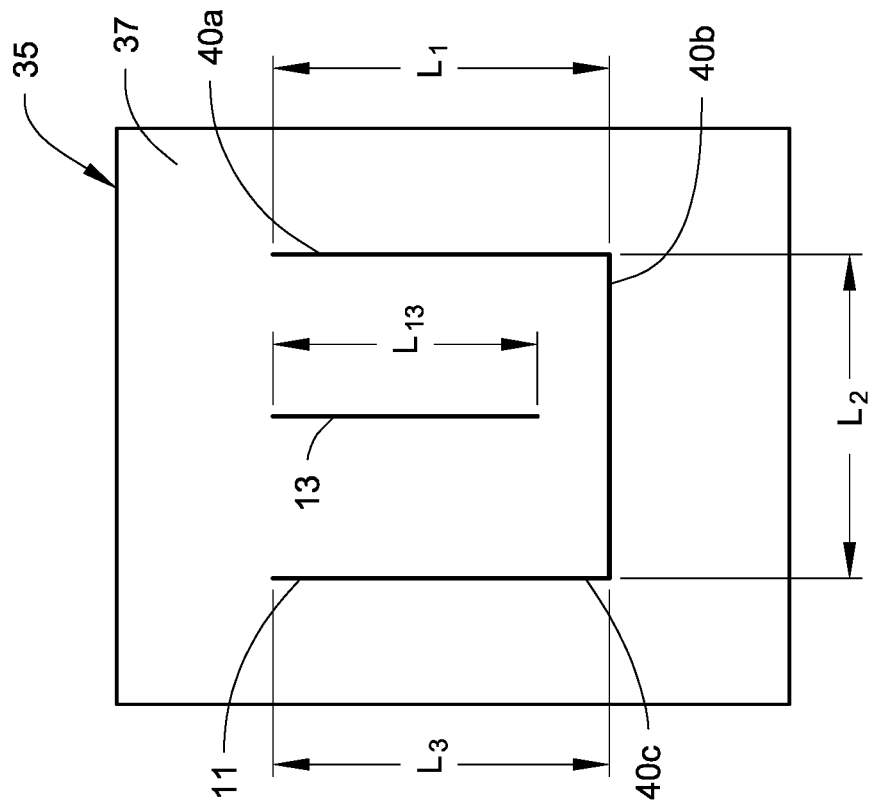
FIGS. 3A-3I illustrate different examples of transmit and receive antennas with different geometries.

With reference initially to FIG. 3A, a plan view of an antenna array having two antennas with different geometries is illustrated. In this example (as well as for the examples in FIGS. 2A-2C and 3B-3I), for sake of convenience in describing the concepts herein, one antenna is labeled as the transmit antenna 11 and the other antenna is labeled as the receive antenna 13. However, the antenna labeled as the transmit antenna 11 could be the receive antenna 13, while the antenna labeled as the receive antenna 13 could be the transmit antenna 11. Each of the antennas 11, 13 are disposed on the substrate 35 having a planar surface 37.

The antennas 11, 13 can be formed as linear strips or traces on the surface 37. In this example, the antenna 11 is generally U-shaped and has a first linear leg 40a, a second linear leg 40b that extends perpendicular to the first leg 40a, and a third linear leg 40c that extends parallel to the leg 40a. Likewise, the antenna 13 is formed by a single leg that extends parallel to, and between, the legs 40a, 40c.

In the example depicted in FIG. 3A, each one of the antennas 11, 13 has at least one lateral dimension that is greater than a thickness dimension thereof (in FIG. 3A, the thickness dimension would extend into/from the page when viewing FIG. 3A). For example, the leg 40a of the antenna 11 extends in one direction (i.e. a lateral dimension) an extent that is greater than a thickness dimension of the leg 40a extending into or out of the page; the leg 40b of the antenna 11 extends in a direction (i.e. a lateral dimension) an extent that is greater than a thickness dimension of the leg 40b extending into or out of the page; and the leg 40c of the antenna 11 extends in one direction (i.e. a lateral dimension) an extent that is greater than a thickness dimension of the leg 40c extending into or out of the page. Likewise, the antenna 13 extends in one direction (i.e. a lateral dimension) an extent that is greater than a thickness dimension of the antenna 13 extending into or out of the page.

The antennas 11, 13 also differ in geometry from one another in that the total linear length of the antenna 11 (determined by adding the individual lengths $L_1$, $L_2$, $L_3$ of the legs 40a-c together) when viewed in plan view is greater than the length $L_{13}$ of the antenna 13 when viewed in plan view.

Figure 3B:
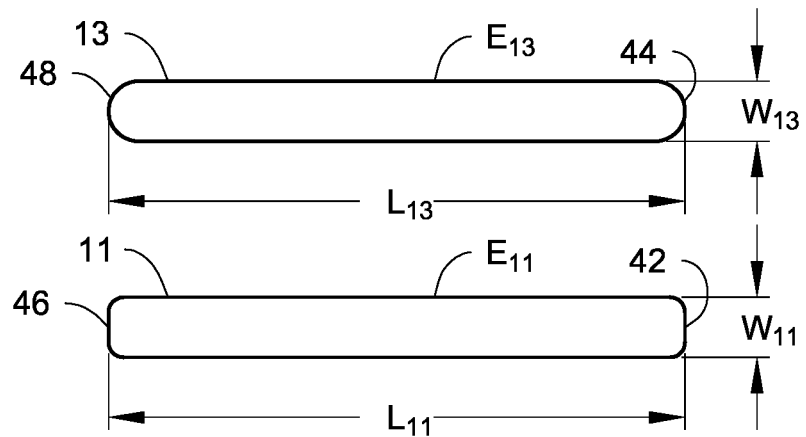

FIG. 3B illustrates another plan view of an antenna array having two antennas with different geometries. In this example, the antennas 11, 13 are illustrated as substantially linear strips each with a lateral length $L_{11}$, $L_{13}$, a lateral width $W_{11}$, $W_{13}$, and a perimeter edge $E_{11}$, $E_{13}$. The perimeter edges $E_{11}$, $E_{13}$ extend around the entire periphery of the antennas 11, 13 and bound an area in plan view. In this example, the lateral length $L_{11}$, $L_{13}$ and/or the lateral width $W_{11}$, $W_{13}$ is greater than a thickness dimension of the antennas 11, 13 extending into/from the page when viewing FIG. 3B. In this example, the antennas 11, 13 differ in geometry from one another in that the shapes of the ends of the antennas 11, 13 differ from one another. For example, when viewing FIG. 3B, the right end 42 of the antenna 11 has a different shape than the right end 44 of the antenna 13. Similarly, the left end 46 of the antenna 11 may have a similar shape as the right end 42, but differs from the left end 48 of the antenna 13 which may have a similar shape as the right end 44. It is also possible that the lateral lengths $L_{11}$, $L_{13}$ and/or the lateral widths $W_{11}$, $W_{13}$ of the antennas 11, 13 could differ from one another.

Figure 3C:
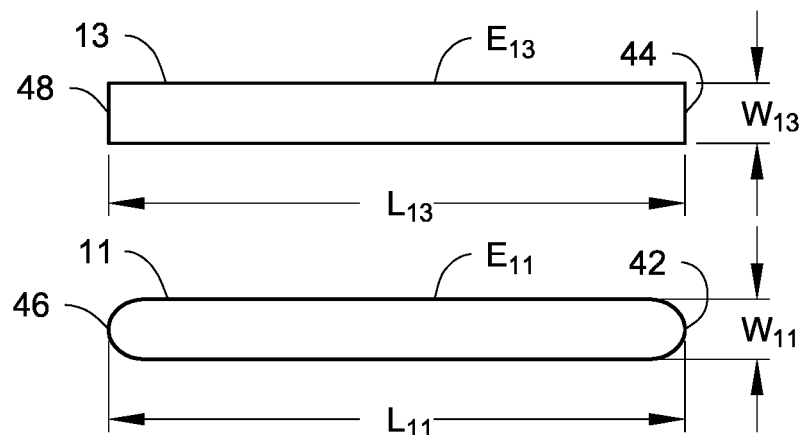

FIG. 3C illustrates another plan view of an antenna array having two antennas with different geometries that is somewhat similar to FIG. 3B. In this example, the antennas 11, 13 are illustrated as substantially linear strips each with the lateral length $L_{11}$, $L_{13}$, the lateral width $W_{11}$, $W_{13}$, and perimeter edge $E_{11}$, $E_{13}$. The perimeter edges $E_{11}$, $E_{13}$ extend around the entire periphery of the antennas 11, 13 and bound an area in plan view. In this example, the lateral length $L_{11}$, $L_{13}$ and/or the lateral width $W_{11}$, $W_{13}$ is greater than a thickness dimension of the antennas 11, 13 extending into/from the page when viewing FIG. 3C. In this example, the antennas 11, 13 differ in geometry from one another in that the shapes of the ends of the antennas 11, 13 differ from one another. For example, when viewing FIG. 3C, the right end 42 of the antenna 11 has a different shape than the right end 44 of the antenna 13. Similarly, the left end 46 of the antenna 11 may have a similar shape as the right end 42, but differs from the left end 48 of the antenna 13 which may have a similar shape as the right end 44. In addition, the lateral widths $W_{11}$, $W_{13}$ of the antennas 11, 13 differ from one another. It is also possible that the lateral lengths $L_{11}$, $L_{13}$ of the antennas 11, 13 could differ from one another.

Figure 3D:
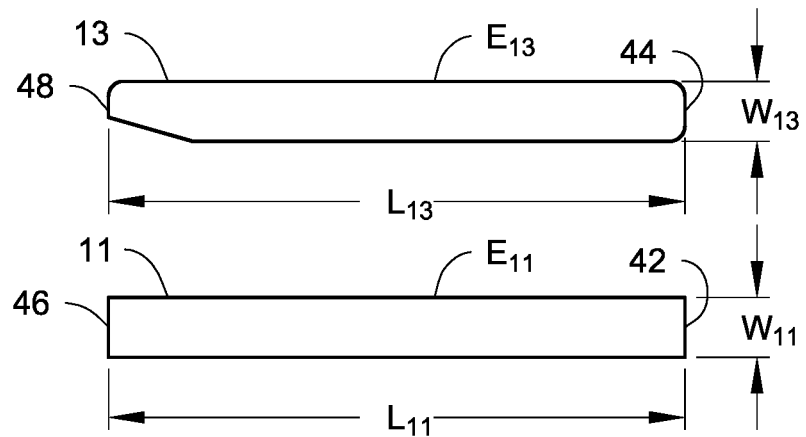

FIG. 3D illustrates another plan view of an antenna array having two antennas with different geometries that is somewhat similar to FIGS. 3B and 3C. In this example, the antennas 11, 13 are illustrated as substantially linear strips each with the lateral length $L_{11}$, $L_{13}$, the lateral width $W_{11}$, $W_{13}$, and the perimeter edge $E_{11}$, $E_{13}$. The perimeter edges $E_{11}$, $E_{13}$ extend around the entire periphery of the antennas 11, 13 and bound an area in plan view. In this example, the lateral length $L_{11}$, $L_{13}$ and/or the lateral width $W_{11}$, $W_{13}$ is greater than a thickness dimension of the antennas 11, 13 extending into/from the page when viewing FIG. 3D. In this example, the antennas 11, 13 differ in geometry from one another in that the shapes of the ends of the antennas 11, 13 differ from one another. For example, when viewing FIG. 3D, the right end 42 of the antenna 11 has a different shape than the right end 44 of the antenna 13. Similarly, the left end 46 of the antenna 11 may have a similar shape as the right end 42, but differs from the left end 48 of the antenna 13 which may have a similar shape as the right end 44. In addition, the lateral widths $W_{11}$, $W_{13}$ of the antennas 11, 13 differ from one another. It is also possible that the lateral lengths $L_{11}$, $L_{13}$ of the antennas 11, 13 could differ from one another.

Figure 3F:
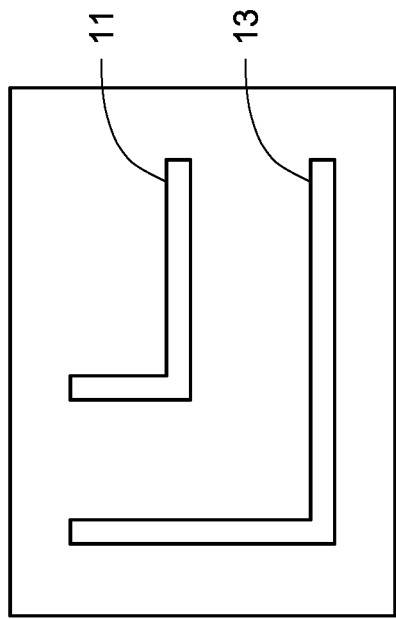
Figure 3G:
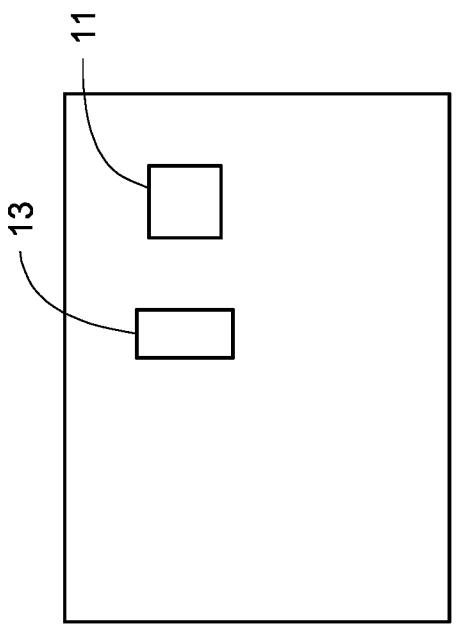
Figure 3E:
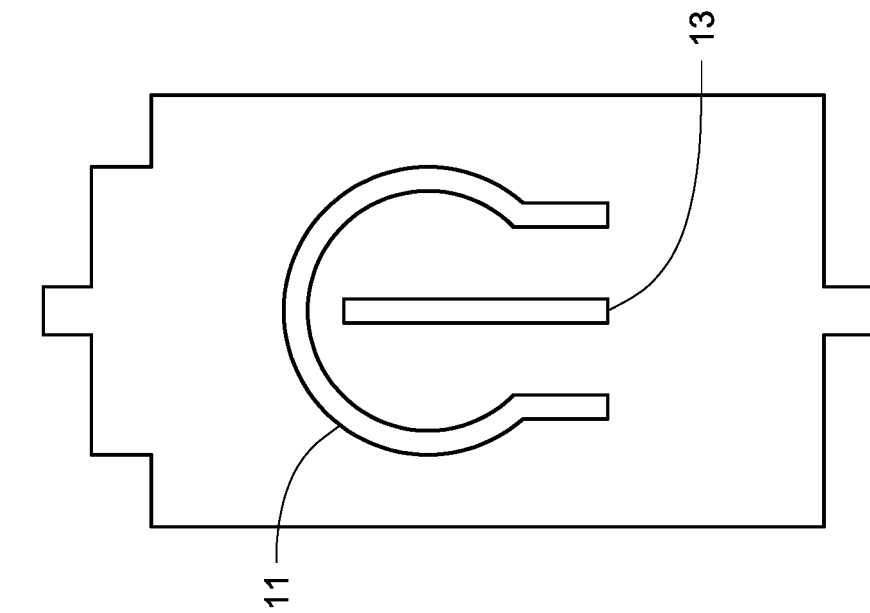

FIG. 3E illustrates another plan view of an antenna array having two antennas with different geometries on a substrate. In this example, the antenna 11 is illustrated as being a strip of material having a generally horseshoe shape, while the antenna 13 is illustrated as being a strip of material that is generally linear. The planar shapes (i.e. geometries) of the antennas 11, 13 differ from one another. In addition, the total length of the antenna 11 (measured from one end to the other) when viewed in plan view is greater than the length of the antenna 13 when viewed in plan.

FIG. 3F illustrates another plan view of an antenna array having two antennas with different geometries on a substrate. In this example, the antenna 11 is illustrated as being a strip of material forming a right angle, and the antenna 13 is also illustrated as being a strip of material that forms a larger right angle. The planar shapes (i.e. geometries) of the antennas 11, 13 differ from one another since the total area in plan view of the antenna 13 is greater than the total area in plan view of the antenna 11. In addition, the total length of the antenna 11 (measured from one end to the other) when viewed in plan view is less than the length of the antenna 13 when viewed in plan.

FIG. 3G illustrates another plan view of an antenna array having two antennas with different geometries on a substrate. In this example, the antenna 11 is illustrated as being a strip of material forming a square, and the antenna 13 is illustrated as being a strip of material that forms a rectangle. The planar shapes (i.e. geometries) of the antennas 11, 13 differ from one another. In addition, at least one of the width/length of the antenna 11 when viewed in plan view is less than one of the width/length of the antenna 13 when viewed in plan.

Figure 3H:
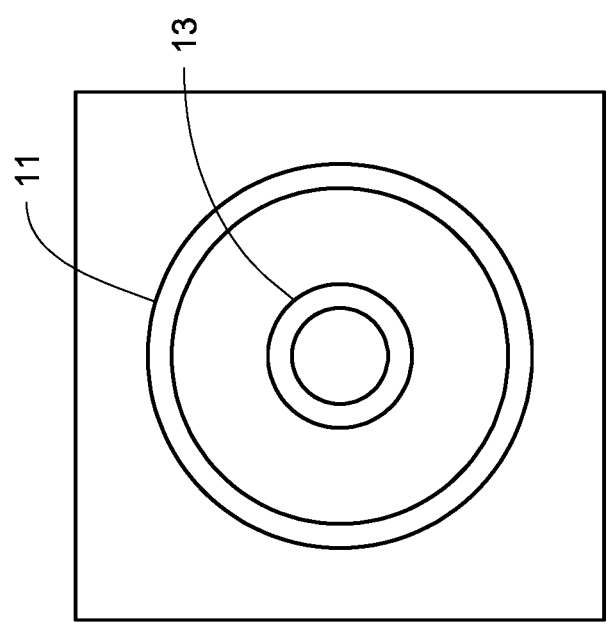

FIG. 3H illustrates another plan view of an antenna array having two antennas with different geometries on a substrate. In this example, the antenna 11 is illustrated as being a strip of material forming a circle when viewed in plan, and the antenna 13 is also illustrated as being a strip of material that forms a smaller circle when viewed in plan surrounded by the circle formed by the antenna 11. The planar shapes (i.e. geometries) of the antennas 11, 13 differ from one another due to the different sizes of the circles.

Figure 3I:
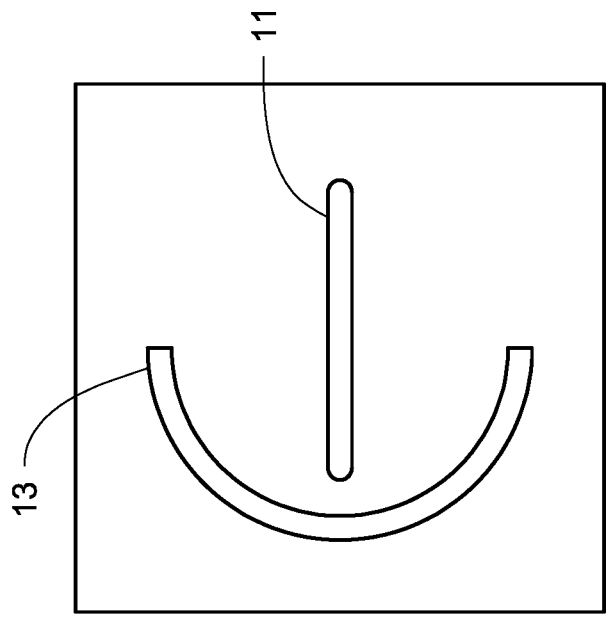

FIG. 3I illustrates another plan view of an antenna array having two antennas with different geometries on a substrate. In this example, the antenna 11 is illustrated as being a linear strip of material, and the antenna 13 is illustrated as being a strip of material that forms a semi-circle when viewed in plan. The planar shapes (i.e. geometries) of the antennas 11, 13 differ from one another due to the different shapes/geometries of the antennas 11, 13.

Figure 4A:
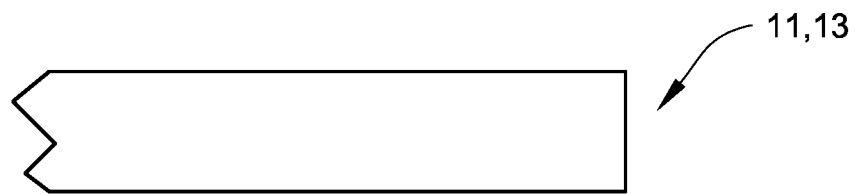
FIGS. 4A, 4B, 4C and 4D illustrate additional examples of different shapes that the ends of the transmit and receive antennas can have.
Figure 4B:
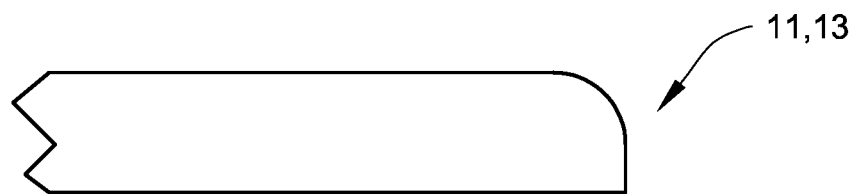
Figure 4C:
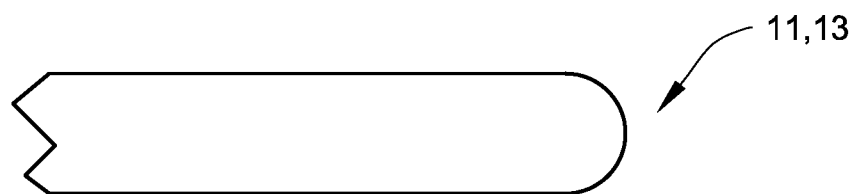
Figure 4D:
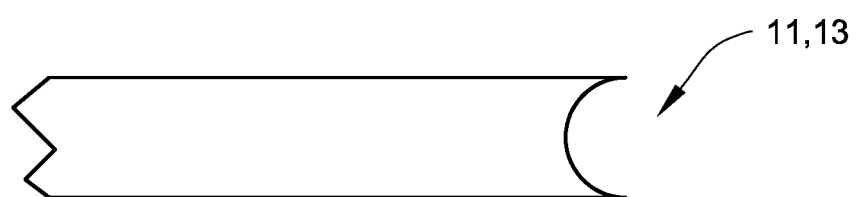

4A-D are plan views of additional examples of different shapes that the ends of the transmit and receive antennas 11, 13 can have to achieve differences in geometry. Either one of, or both of, the ends of the antennas 11, 13 can have the shapes in FIGS. 4A-D, including in the embodiments in FIGS. 3A-I. FIG. 4A depicts the end as being generally rectangular. FIG. 4B depicts the end as having one rounded corner while the other corner remains a right angle. FIG. 4C depicts the entire end as being rounded or outwardly convex. FIG. 4D depicts the end as being inwardly concave. Many other shapes are possible.

Another technique to achieve decoupling of the antennas 11, 13 is to use an appropriate spacing between each antenna 11, 13 with the spacing being sufficient to force most or all of the signal(s) transmitted by the transmit antenna 11 into the medium, thereby minimizing the direct receipt of electromagnetic energy by the receive antenna 13 directly from the transmit antenna 11. The appropriate spacing can be used by itself to achieve decoupling of the antennas 11, 13. In another embodiment, the appropriate spacing can be used together with differences in geometry of the antennas 11, 13 to achieve decoupling.

Referring to FIG. 2A, there is a spacing D between the transmit antenna 11 and the receive antenna 13 at the location indicated. The spacing D between the antennas 11, 13 may be constant over the entire length (for example in the X-axis direction) of each antenna 11, 13, or the spacing D between the antennas 11, 13 could vary. Any spacing D can be used as long as the spacing D is sufficient to result in most or all of the signal(s) transmitted by the transmit antenna 11 reaching the medium and minimizing the direct receipt of electromagnetic energy by the receive antenna 13 directly from the transmit antenna 11, thereby decoupling the antennas 11, 13 from one another.

Figure 5:
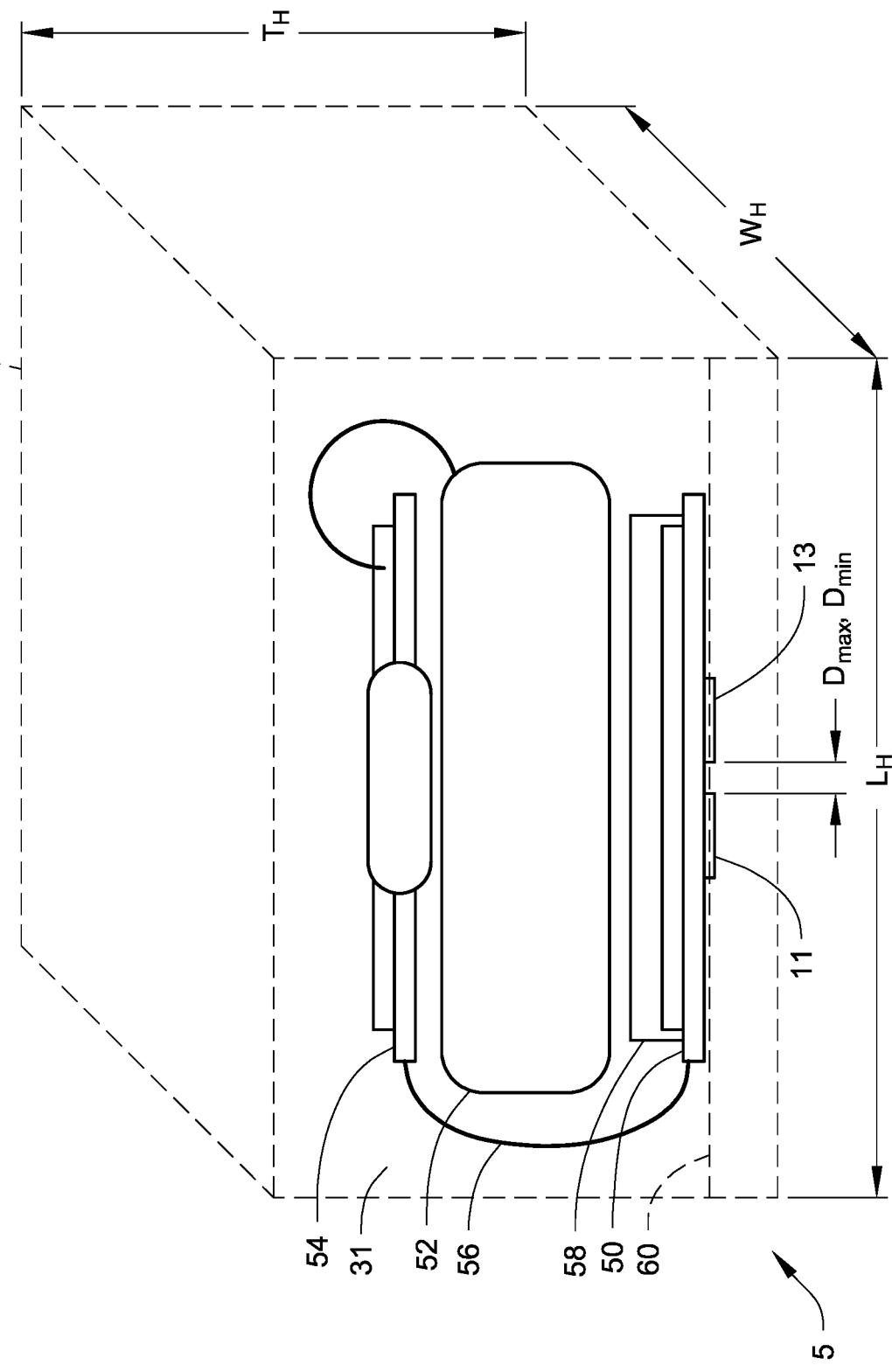
FIG. 5 is a schematic depiction of a sensor device according to an embodiment.

Referring to FIG. 5, an example configuration of the sensor device 5 is illustrated. In FIG. 5, elements that are identical or similar to elements in FIG. 1 are referenced using the same reference numerals. In FIG. 5, the antennas 11, 13 are disposed on one surface of a substrate 50 which can be, for example, a printed circuit board. At least one battery 52, such as a rechargeable battery, is provided above the substrate 50, for providing power to the sensor device 5. In addition, a digital printed circuit board 54 is provided on which the transmit circuit 15, the receive circuit 17, and the controller 19 and other electronics of the second device 5 can be disposed. The substrate 50 and the digital printed circuit board 54 are electrically connected via any suitable electrical connection, such as a flexible connector 56. An RF shield 58 may optionally be positioned between the antennas 11, 13 and the battery 52, or between the antennas 11, 13 and the digital printed circuit board 54, to shield the circuitry and electrical components from RF interference.

As depicted in FIG. 5, all of the elements of the sensor device 5, including the antennas 11, 13, the transmit circuit 15, the receive circuit 17, the controller 19, the battery 52 and the like are contained entirely within the interior space 31 of the housing 29. In an alternative embodiment, a portion of or the entirety of each antenna 11, 13 can project below a bottom wall 60 of the housing 29. In another embodiment, the bottom of each antenna 11, 13 can be level with the bottom wall 60, or they can be slightly recessed from the bottom wall 60.

The housing 29 of the sensor device 5 can have any configuration and size that one finds suitable for employing in a non-invasive sensor device. In one embodiment, the housing 29 can have a maximum length dimension $L_H$ no greater than 50 mm, a maximum width dimension $W_H$ no greater than 50 mm, and a maximum thickness dimension $T_H$ no greater than 25 mm, for a total interior volume of no greater than about 62.5 cm$^3$.

In addition, with continued reference to FIG. 5 together with FIGS. 3A-3I, there is preferably a maximum spacing $D_{max}$ and a minimum spacing $D_{min}$ between the transmit antenna 11 and the receive antenna 13. The maximum spacing $D_{max}$ may be dictated by the maximum size of the housing 29. In one embodiment, the maximum spacing $D_{max}$ can be about 50 mm. In one embodiment, the minimum spacing $D_{min}$ can be from about 1.0 mm to about 5.0 mm.

Figure 6:
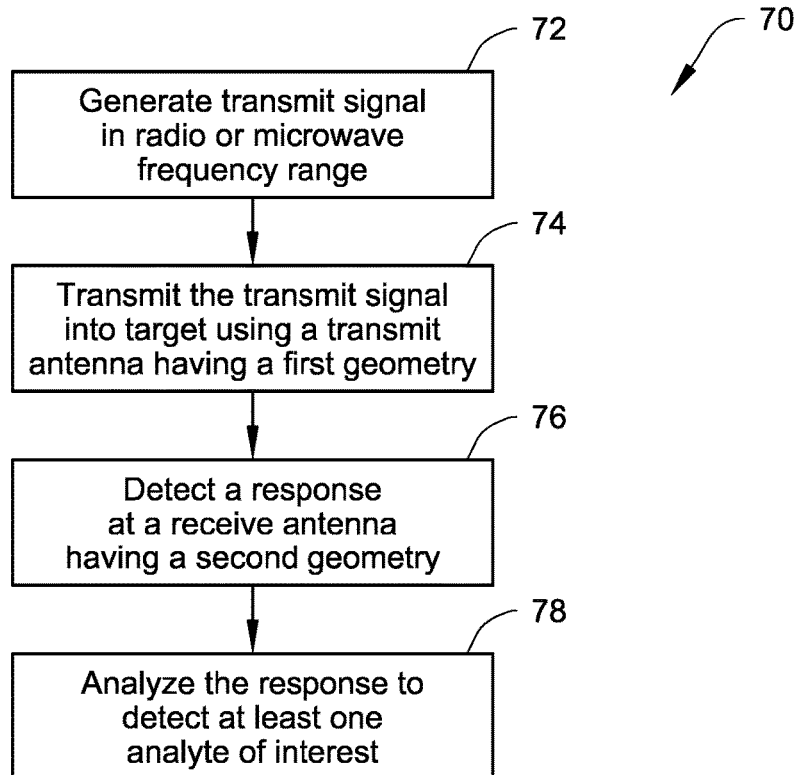
FIG. 6 is a flowchart of a method for detecting an analyte according to an embodiment.

With reference now to FIG. 6 together with FIG. 1, one embodiment of a method 70 for detecting at least one analyte in a target, such as the medium or sample thereof being monitored by the sensor 5. is depicted. The method in FIG. 6 can be practiced using any of the embodiments of the sensor device 5 described herein. In order to detect the analyte, the sensor device 5 is placed in relatively close proximity to the target. Relatively close proximity means that the sensor device 5 can be close to but not in direct physical contact with the target, or alternatively the sensor device 5 can be placed in direct, intimate physical contact with the target. The spacing between the sensor device 5 and the target 7 can be dependent upon a number of factors, such as the power of the transmitted signal. Assuming the sensor device 5 is properly positioned relative to the target 7, at box 72 the transmit signal is generated, for example by the transmit circuit 15. The transmit signal is then provided to the transmit antenna 11 which, at box 74, transmits the transmit signal toward and into the target. At box 76, a response resulting from the transmit signal contacting the analyte(s) is then detected by the receive antenna 13. The receive circuit 17 obtains the detected response from the receive antenna 13 and provides the detected response to the controller 19. At box 78, the detected response can then be analyzed to detect at least one analyte. The analysis can be performed by the controller 19 and/or by the external device 25 and/or by the remote server 27.

Figure 7:
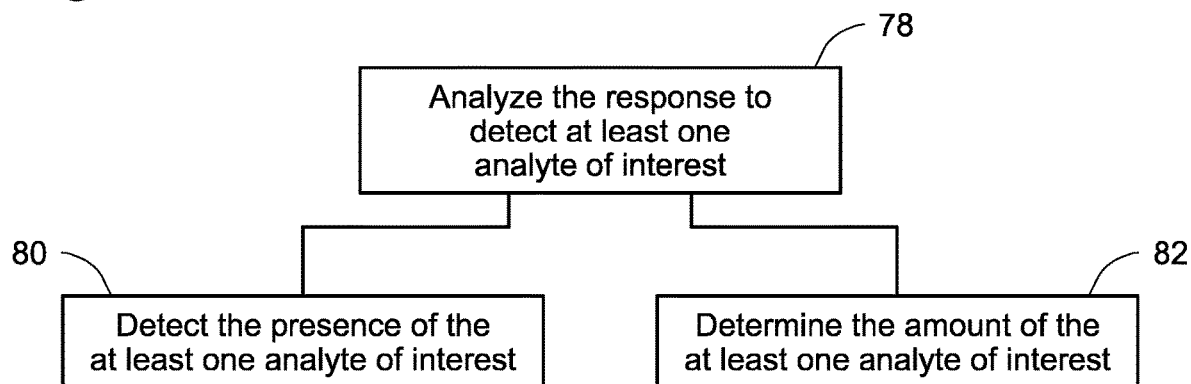
FIG. 7 is a flowchart of analysis of a response according to an embodiment.

Referring to FIG. 7, the analysis at box 78 in the method 70 can take a number of forms. In one embodiment, at box 80, the analysis can simply detect the presence of the analyte, i.e. is the analyte present in a target, such as the medium or sample thereof being monitored by the sensor 5. Alternatively, at box 82, the analysis can determine the amount of the analyte that is present.

The interaction between the transmitted signal and the analyte may, in some cases, increase the intensity of the signal(s) that is detected by the receive antenna, and may, in other cases, decrease the intensity of the signal(s) that is detected by the receive antenna. For example, in one non-limiting embodiment, when analyzing the detected response, compounds in the target, including the analyte of interest that is being detected, can absorb some of the transmit signal, with the absorption varying based on the frequency of the transmit signal. The response signal detected by the receive antenna may include drops in intensity at frequencies where compounds in the target, such as the analyte, absorb the transmit signal. The frequencies of absorption are particular to different analytes. The response signal(s) detected by the receive antenna can be analyzed at frequencies that are associated with the analyte of interest to detect the analyte based on drops in the signal intensity corresponding to absorption by the analyte based on whether such drops in signal intensity are observed at frequencies that correspond to the absorption by the analyte of interest. A similar technique can be employed with respect to increases in the intensity of the signal(s) caused by the analyte.

Detection of the presence of the analyte can be achieved, for example, by identifying a change in the signal intensity detected by the receive antenna at a known frequency associated with the analyte. The change may be a decrease in the signal intensity or an increase in the signal intensity depending upon how the transmit signal interacts with the analyte. The known frequency associated with the analyte can be established, for example, through testing of solutions known to contain the analyte. Determination of the amount of the analyte can be achieved, for example, by identifying a magnitude of the change in the signal at the known frequency, for example using a function where the input variable is the magnitude of the change in signal and the output variable is an amount of the analyte. The determination of the amount of the analyte can further be used to determine a concentration, for example based on a known mass or volume of the target. In an embodiment, presence of the analyte and determination of the amount of analyte may both be determined, for example by first identifying the change in the detected signal to detect the presence of the analyte, and then processing the detected signal(s) to identify the magnitude of the change to determine the amount.

Determination of a Variability in a State of a Medium

Figure 8:
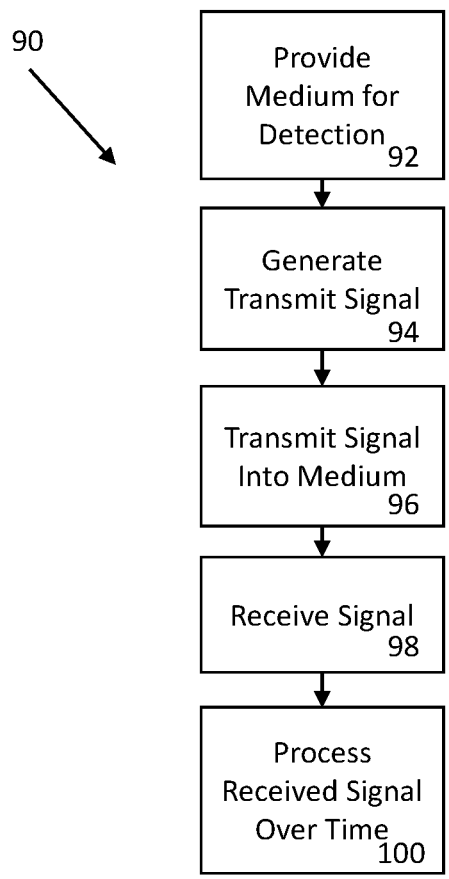
FIG. 8 is a flowchart of a method for determining the variability in a state in a medium.

FIG. 8 is a flowchart of a method 90 for determining the variability in a state in a medium. Method 90 can be performed using a sensor such as sensor 5 described above or a system including such a sensor. The state can be, for example, temperature of the medium, volume of the medium, density of the medium, or composition of the medium or sample thereof, such as the distribution of materials within the medium or sample thereof, indicative of mixing or separation. Variability in the composition of a sample of the medium can be indicative of the extent of mixing of the medium as a whole. Method 90 includes providing a medium or sample thereof for detection 92, generating a transmit signal 94, transmitting the transmit signal into the medium or sample thereof 96, receiving a receive signal 98, and processing the receive signal over time to determine variability in the state of the medium.

The medium or sample thereof can be provided for detection 92. Providing a medium to be detected at 92 can include, for example, placing a sensor such as sensor 5 in proximity to the medium, for example by placing sensor housing 29 against the medium or a vessel containing the medium. A sample of the medium can be provided for detection 92 by, for example, directing a flow of a portion of the medium through a fluid passage such as a pipe or a channel, with the fluid passage conveying the sample of the medium past the sensor 5 and returning the sample to the medium. The flow through the fluid passage can be provided using, for example, a pump, impeller, or any other suitable means of providing a flow of the medium through the fluid passage A transmit signal is generated at 94. The transmit signal can be a signal with the properties described above, and the transmit signal is transmitted 96 into the medium or sample thereof provided at 92. The transmit signal transmitted at 96 enters the medium or sample thereof and results in a receive signal, which is received at 98 using one or more receive elements or antenna of the sensor 5.

The receive signal received at 98 is then processed over time 100. In an embodiment, the processing over time 100 can be processing of time-separated discrete samples of the receive signal and comparison of the samples to determine variability across those samples. In another embodiment, the processing of the receive signal can be continuous monitoring of the receive signal for variability over time in the receive signal. The receive signal corresponds to one or more states of the medium or sample thereof or composition of the medium or sample thereof. Processing of the receive signal over time at 100 can include determining variability over time of the states of the medium. In an embodiment, the processing of the receive signal over time can further include using the variability in the receive signal over time to determine whether the medium is in a steady state condition, such as holding at a constant temperature or being homogeneously mixed. In an embodiment, the steady state condition can be determined when the variability of the state of the medium is within certain boundaries. For example, when the variability in the receive signal over time is below a certain threshold, the steady state condition can be determined.

Figure 9:
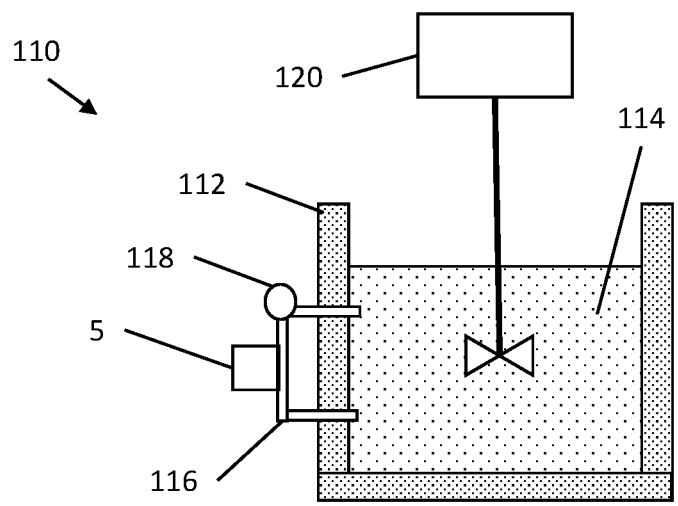
FIG. 9 shows a schematic of a system for determining variability in a state of a medium by analyzing a sample of the medium.

FIG. 9 shows a schematic of a system 110 for determining variability in a state of a medium by analyzing a sample of the medium. System 110 includes vessel 112 containing the medium 114, fluid passage 116, pump 118, and sensor 5. In embodiments, system 110 can further include an external device 25 and/or a remote server 27 as shown in FIG. 1 and described above. Vessel 112 is any suitable vessel for containing medium 114. Medium 114 is a medium which is being monitored for variability in a state such as temperature, volume, phase, density, or composition of the medium, for example to indicate an extent of mixing or separation of the medium. Medium 114 can be a fluid such as a liquid or a gas. In an embodiment, medium 114 is a liquid. In an embodiment, medium 114 is a reaction mixture. In an embodiment, medium 114 is being mixed using an optional mixer 120. Mixer 120 can be, for example, an impeller or any other suitable device for mixing medium 114. In an embodiment, sensor 5, external device 25, and/or remote server 27 can communicate with mixer 120, for example to stop mixing once medium 114 is determined to be suitably mixed, for example when medium 114 is determined to be homogeneous.

Fluid passage 116 is a passage configured to allow a portion of medium 114 in vessel 112 to be conveyed past sensor 5. Fluid passage 116 can be a pipe, a channel, a liquid line, or any other suitable passage for conveying the flow of a portion of the medium 114 past the sensor 5. In an embodiment, fluid passage 116 can further return the flow of the portion of medium 114 to the vessel 112. Flow through fluid passage 116 can be driven by pump 118. Pump 118 can be located upstream or downstream of the sensor 5 with respect to the flow through fluid passage 116. Pump 118 can be any suitable mechanism for providing flow through fluid passage 116.

Sensor 5 provides a transmit signal to and receives a return signal from the flow of the portion of medium 114 passing through fluid passage 116. The return signal can be processed over time at any of sensor 5, external device 25, and/or remote server 27 to determine variability in a state of medium 114. Optionally, the variability in the state of the medium can be used to provide notifications, such as at sensor 5, external device 25, and/or remote server 27, or direct automated actions such as control of devices such as mixer 120, or any other suitable control that may be operated based on variability in the state of medium 114.

Notifications Regarding Determined Variability in a State of a Medium

Figure 10:
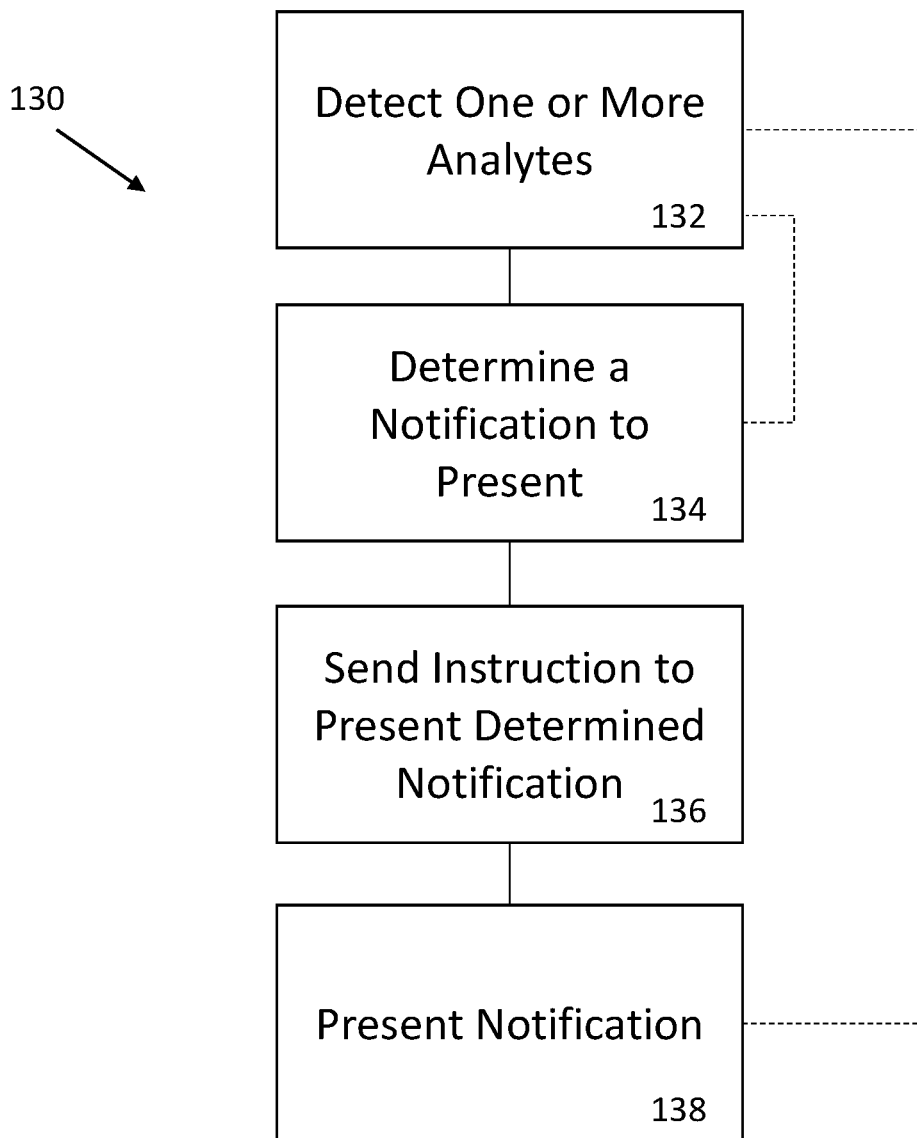
FIG. 10 is a flowchart of a method of providing a notification regarding variability in a state of a medium according to an embodiment.

FIG. 10 is a flowchart of a method 130 of providing a notification regarding one or more analytes according to an embodiment. The method 130 can include determining the variability in a state of a medium 132, determining a notification to present 134, sending an instruction to present the determined notification 136, and providing the notification 138. The method 130 can be performed continuously, repeated iteratively, performed according to a predetermined schedule or sampling frequency, or when triggered by an event or a user prompt.

Variability in a state of a medium is determined at 132. The determination of the variability in the state of the medium can be according to any of the methods described herein. Determination of a notification to present occurs at 134. The determination of the notification to present at 94 is based on variability in the state of the medium determined at 132 and notification criteria. Satisfaction of notification criteria by the variability in the state of the medium at 132 can be used determine the notification to present. In an embodiment, when no notification criteria are satisfied, no notification to present may be determined. In an embodiment, method 130 can return from 134 to 132 when no notification is determined to be presented at 134, for example when no notification criteria are satisfied. The determination is made at 134 using a processor that is configured to receive the results of the determination of variability in the state of the medium at 132. The notification criteria can be stored in a memory that is operatively connected to the processor that determines the presentation of the notification at 134, such that the processor can receive the notification criteria. The determination can be made at one or more devices, such as, for example, sensor 5, external device 25, or remote server 27 shown in FIG. 1 and described above.

In an embodiment, the notification criteria include an upper threshold, and it is determined that the notification is to be presented when the variability in the state of the medium exceeds said upper threshold. In this embodiment, a notification associated with this notification criterion can be an alert regarding a high rate of change in the state of the medium, such as large temperature changes, or high variability in the composition of the medium. In an embodiment, the notification criteria include a lower threshold, and the notification to present is determined when the amount of the analyte is below the lower threshold. In an embodiment, the notification criteria include a lower threshold selected to indicate a steady state condition such as holding a constant temperature or a mixture being homogeneous, and a notification associated with this lower threshold is a message indicative of achieving this steady state condition.

In an embodiment, the notification criteria used to determine the notification to present at 134 includes the variability in multiple states of the medium. The notification criteria can include criteria for the variability for each of the multiple states, combined using any logical or conditional operators such as, as non-limiting examples, OR, AND, or IF-THEN statements.

Once a notification to present is determined at 134, an instruction to present the determined notification is sent 136. In an embodiment, the instruction to present the determined notification sent at 136 is sent within a device from, for example, a processor of a device to one or more of a light, a display, a speaker, or a vibrating component included in the same device. In an embodiment, the instruction to present the determined notification sent at 136 is sent from one device to another, for example from sensor 5 to external device 25 shown in FIG. 1, from external device 25 to sensor 5, or from remote server 27 to one or both of the sensor 5 and external device 25. The instruction can be sent using, for example, wireless communications such as cellular data, Wi-Fi, Bluetooth, ZigBee, or any other suitable communications protocol for sending a message between devices. In an embodiment, the instruction can be a direct command to the one or more of a light, a display, a speaker, or a vibrating component. In an embodiment, the instruction can be a message within the context of a software application such as an app for a mobile device, the software application then presenting the determined notification using the one or more of a light, a display, a speaker, or a vibrating component.

The notification can be provided at 138. The notification can include one or more of a visual component, an audible component or a tactile component. The notification can be provided at a device such as, for example sensor 5 or external device 25 shown in FIG. 1 and described above.

The visual component can include, as non-limiting examples, display of a light, presenting a color of a light, control of a frequency or pattern of flashing of a light, presenting a still or animated image using a display or projector, or presenting text using a display or projector. The visual component can be presented at 138 using one or more lights such as LED lights or a display included on a device such as, for example, sensor 5 or external device 25 shown in FIG. 1 and described above. The audible component can include, as non-limiting examples, one or more tones, a pattern of producing the one or more tones, a repeating alarm, playing of a voice message including speech, or any other suitable audible notification. The audible component can be presented at 138 using, for example, a speaker included on a device such as, for example, sensor 5 or external device 25 shown in FIG. 1 and described above. The tactile component can include, as non-limiting examples, vibration of a device, the pattern or frequency of vibration of the device, or the like. The tactile component can include haptic feedback. The tactile component can be presented at 138 using a vibrating component included on a device such as, for example, sensor 5 or external device 25 shown in FIG. 1 and described above. Any of the visual, audible, and tactile components can be combined to form the notification presented at 138. The notification can be indicative of the medium being at a steady state condition, experiencing rapid change in one or more states, or any other suitable notification regarding the variability in states of the medium.

As indicated above, the data obtained by the sensor 5 needs to be analyzed, for example by determining a notification to present based on said data as described above. The analysis can occur on the sensor 5 or on one or more devices or systems separate from the sensor 5. Unless otherwise indicated by the Applicant, the term devices or systems is intended to be construed broadly as encompassing any type of devices or systems that can analyze the data obtained by the sensor 5. Examples of devices or system that can be used to analyze the data include, but are not limited to, hardware-based computing devices or systems; cloud-based computing devices or systems; machine learning devices or systems including active learning devices or systems; artificial intelligence-based devices or systems; neural network-based devices or systems; combinations thereof; and any other types of devices and systems that are suitable for analyzing the data.

One or more output signals resulting from or based on the analysis are then generated. In an embodiment, the output signal is a signal indicative that the medium is in a steady-state condition. In an embodiment, the steady-state condition is indicative of a desired property of the medium, such as being a homogeneous mixture, holding a consistent temperature, having fully separated fractions of the medium, or the like. In some embodiments, the output signal(s) is generated by the device(s) or system(s) that analyze the data. The output signal(s) is directed to one or more other devices or systems that implement an action based on the output signal(s). In one embodiment, the output signal(s) is directed to one or more notification devices (discussed further below) which generates at least one human perceptible notification for example to provide a perceptible signal or alert to the patient and/or a caregiver of the patient. In this embodiment, the output signal(s) may be referred to as a notification signal(s). In another embodiment, the output signal(s) may be directed to one or more other machine(s) or system(s), for example a medical device such as an insulin pump, that modifies the operation of the other machine(s) or system(s). In one embodiment, the output signal(s) or separate output signals can be directed to both one or more notification devices and one or more other machine(s) or system(s). In one embodiment, the output signal(s) can be stored in a suitable data storage separately from, or in addition to, being sent to one or more notification devices and/or to one or more other devices or systems.

Figure 11:
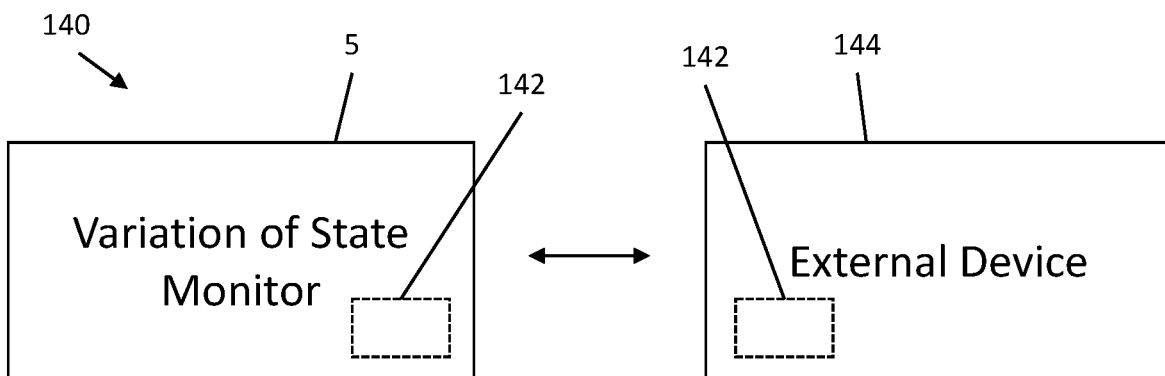
FIG. 11 illustrates one non-limiting example of an output signal generation.

FIG. 11 illustrates one non-limiting example of an output signal generation. In this example, an output signal is sent to a notification device 142 included in the system 140 to generate at least one human perceptible notification resulting from the analysis. The notification device 142 can be connected, directly or indirectly, to the system 140. For example, in one embodiment, the notification device 142 can be incorporated on the sensor 5 to provide the at least one human perceptible notification directly to the person using or wearing the sensor 5. In another embodiment, the notification device 142 can be incorporated into a device 144 that is physically separate from the sensor 5 including, but not limited to, a mobile phone (a.k.a. cell phone, smartphone); a tablet computer; a laptop computer; a personal computer; a wearable device such as a watch or a head-mounted device or clothing; a video game console; furniture such as a chair; a vehicle such as a car, automobile or truck; lightbulbs; smart home appliances such as a smart refrigerator; and a use specific device similar to these devices that is specifically designed to function with the sensor 5. The at least one human perceptible notification generated by the notification device 142 can be one or more of an audible sound notification, a visual notification, a haptic notification, or an olfactory notification. Operation of the notification device 142 can be triggered by a notification or output signal that is generated resulting from the analysis. The notification signal can be generated by the sensor 5, for example by the main controller thereof, or by a separate device or system as described above that performs the analysis after receiving the data from the sensor 5.

Automated Response to State of Medium

Figure 12:
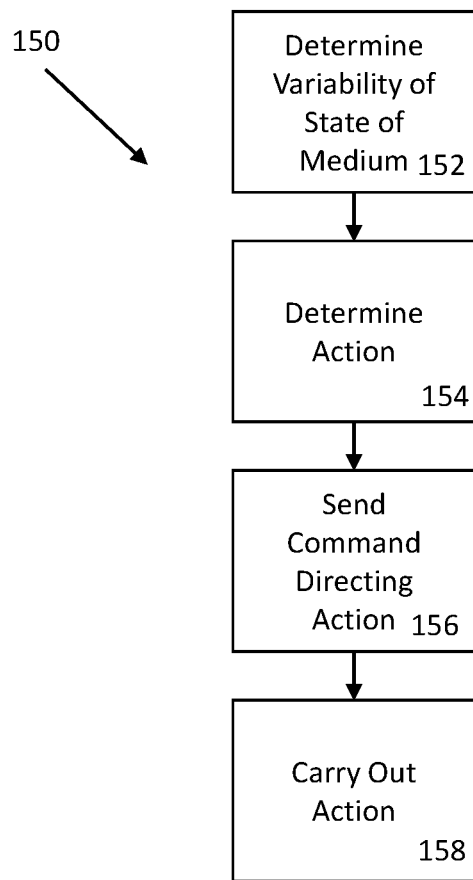
FIG. 12 is a flowchart of a method of providing an automated response to determination of variability in a state of a medium according to an embodiment.

FIG. 12 is a flowchart of a method of providing an automated response to detection of one or more analytes according to an embodiment. The method 150 can include determining a variability in a state of a medium 152, determining an action to take 154, providing an instruction directing the determined action 156, and taking the action 158. The method 150 can be performed continuously, repeated iteratively, performed according to a predetermined schedule or sampling frequency, or when triggered by an event or a user prompt.

The variability in a state of a medium is determined at 152. The determination of the variability in the state of the medium can be performed using any of the sensors and/or systems described herein. The variability in the state of the medium can be determined according to any of the methods described herein.

Determination of an action to take occurs at 154. The action can be any suitable response to the variability in the state of the medium that can be implemented by one or more control devices. The action can modify one or more properties of the medium or components thereof, direct a flow of the medium, control mixing of the medium, or the like. The properties that can be affected by the action determined at 154 can include, as non-limiting examples, physical properties such as density, shape, distributions of different materials, or viscosity, chemical properties such as the stereochemistry of one or more materials, temperatures, electrical properties such as resistivity, or the like. The properties can be altered, for example, by using mechanical devices to move or stir the materials or to alter shape of a vessel containing the medium, adding additives to the medium, directing the medium through one or more filters, or any other such suitable action based on the desired response to the detection of the at least one analyte, the one or more properties to be affected in such a response, and mechanical acts and/or chemical interactions usable to produce the effects on the one or more properties.

The action can be determined at 154 based on the particular application, the state for which variability is being determined, and the capabilities of the automated controls. As non-limiting examples, the action can include adding reagents to the medium, adjusting operation of a mixer such as mixer 120 operating on the medium, The action can be determined at 154 based on logic relating to the variability in the state determined at 152. The determination of the action can be performed, for example, at the device including the sensor, a local device separate from but located in proximity to the device including the sensor, a remote server such as a cloud server, or any other suitable device including a controller configured to determine the action. The logic can include, for example, upper and/or lower boundaries for the variability in the state of the medium determined at 154 or any other suitable logic allowing a controller to associate the variability in the state of the medium with actions responsive to the detection.

Once the action to take is determined at 154, an instruction directing the determined action is provided 156. The instruction can be any suitable command to direct taking of the action determined at 154. The instruction can be provided at 156 by conveying the command to the device taking action, for example by a wired connection, any suitable wireless communications, or combinations thereof. One more devices may be involved in conveying the command, such as a remote server conveying the command to a local device that then conveys the instruction to the device taking action. Once the instruction is provided at 156, the action can be taken at 158. The action can be taken at 158 by operating any suitable device according to the instruction provided at 156, such as opening or closing one or more valves, moving one or more vanes, replacing filters, starting or stopping a mixing device, or adjusting a flow of a material into the medium. In an embodiment, the material can be a material reactive with a component in the medium. In an embodiment, the material can be a material capable of affecting properties of the medium such as density, viscosity, or resistivity of the medium, such as an additive. In an embodiment, the action can be heating or cooling the medium. For example, the action can include heating the medium using a heating element, heat lamp, or other suitable heat source. In an embodiment, the action can include cooling the medium, for example using a refrigeration circuit, addition of materials at relatively lower temperature than the medium, or other suitable device or technique for cooling the medium.

As indicated above, the data obtained by the sensor 5 needs to be analyzed, for example by determining an action to take based on said data as described above, and causing that action to be automatically performed. The analysis can occur on the sensor 5 or on one or more devices or systems separate from the sensor 5. Unless otherwise indicated by the Applicant, the term devices or systems is intended to be construed broadly as encompassing any type of devices or systems that can analyze the data obtained by the sensor 5. Examples of devices or system that can be used to analyze the data include, but are not limited to, hardware-based computing devices or systems; cloud-based computing devices or systems; machine learning devices or systems including active learning devices or systems; artificial intelligence-based devices or systems; neural network-based devices or systems; combinations thereof; and any other types of devices and systems that are suitable for analyzing the data. The devices can be located at any suitable location, incorporated into a device including sensor 5, or in a separate device local to or remote from sensor 5.

One or more output signals resulting from or based on the analysis are then generated. In some embodiments, the output signal(s) is generated by the device(s) or system(s) that analyze the data. The output signal(s) is directed to one or more other devices or systems that implement an action based on the output signal(s). In one embodiment, the output signal(s) is directed to one or more machine(s) or system(s) that modifies the operation of the machine(s) or system(s). In one embodiment, the output signal(s) can be stored in a suitable data storage separately from, or in addition to, being sent to one or more machines or systems, for example to log actions directed by the system.

Figure 13:
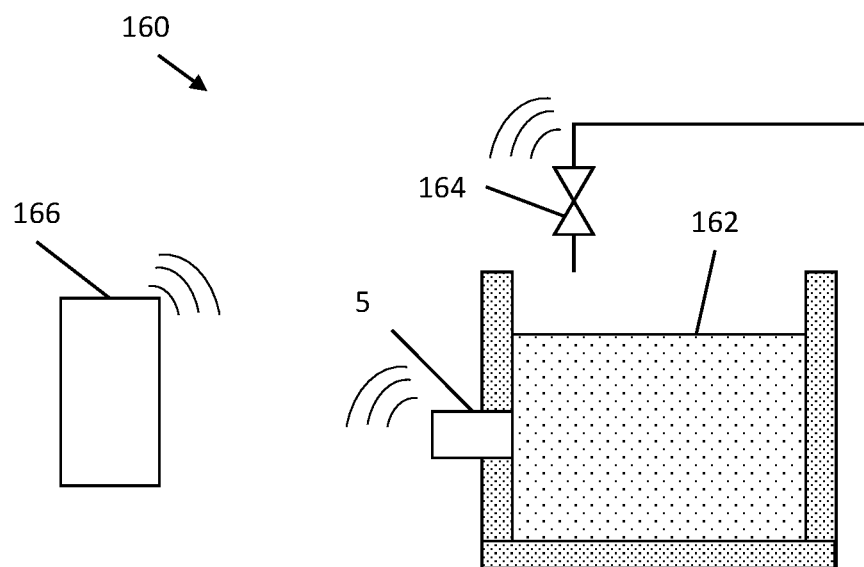
FIG. 13 illustrates one non-limiting example of a system 160 configured to automatically carry out an action.

FIG. 13 illustrates one non-limiting example of a system 160 configured to automatically carry out an action. In this example, sensor 5 analyzes a medium 162 and generates an output signal that is sent to a control device 164 included in the system 160. In an embodiment, the output signal may pass to remote device 166 prior to reaching control device 164.

Medium 162 is the medium in which variability in a state is being determined based on signals transmitted and received by sensor 5. Medium 102 can include, but is not limited to, human tissue, animal tissue, plant tissue, an inanimate object, soil, a fluid, genetic material, or a microbe. In an embodiment, medium 162 is a flow of a fluid, such as flow of a compound through a fluid line, blood flow within a person or animal, or the like. In an embodiment, medium 162 is fluid located within a vessel, such as a beaker, cuvette, sample storage container, reaction bag or vessel, or any other such suitable vessel for containing the fluid. Non-limiting examples of medium 162 can include, for example, samples for analysis or screening such as blood samples, reaction mixtures or additions thereto such as chemical feed stocks, process outputs such as output flows from chemical reactors, drugs for administration to patients such as fluid for intravenous (IV) delivery, fluids upstream and/or downstream of filters, or any other medium where the presence or amount of an analyte can be responded to through automated controls. In an embodiment, a flow of a portion of medium 162 can be provided to sensor 5 for the determination of variability in the state of the medium 162, for example using a fluid passage such as fluid passage 116 described above and shown in FIG. 9.

Control device 164 is configured to act in response to a command. The control device 164 can be connected, directly or indirectly, to the system 160. In the embodiment shown in FIG. 13, control device 164 is configured to wirelessly receive the command from either sensor 5 or separate device 166. The control device can be any suitable device, such as a mechanical device, heating or cooling device, or the like, for carrying out an action determined based on detection or amounts of one or more analytes. Non-limiting examples of control device 164 include, for example, valves, pumps, flow directors, fluid metering devices, fans, heat exchangers, heating elements, mixing devices or the like. In embodiments, control device 164 can control a flow that then interacts with medium 162. For example, in one embodiment, medium 162 can be a reaction mixture and control device 164 can control a flow of a compound that is being added to the medium 162, such as a particular reagent used in the reaction mixture. In other embodiments, control device 164 can control flow of the medium 162 itself. For example, control device 164 controlling the flow of medium 162 can operate to allow a flow of medium 162 when the medium 162 is in a steady state condition such as being a homogeneous mixture. Non-limiting examples of actions taken by control device 164 include opening or closing a valve, moving an adjustable valve to a particular aperture size or flow setting, activating or deactivating a pump, setting a flow rate for a pump, selecting a duct or fluid line that a flow director allows flow to enter, providing heating or cooling to medium 162, setting a delivery rate for a controlled IV drip or an insulin pump, or the like. In an embodiment, multiple control devices 164 can each take particular actions based on determination of the variability in the state of the medium 162.

In an embodiment, the control device 164 can be co-located in a same device as sensor 5. In another embodiment, the control device 164 can be physically separate from the sensor 5. In an embodiment, processing of signals from sensor 5 to determine action to be taken at control device 104 can be performed at the device including sensor 5. In an embodiment, processing of signals from sensor 5 to determine action to be taken at a control device 164 can be performed at a controller included in control device 164. In an embodiment, the processing of signals can be performed at a controller included in a separate device 166 that is separate from both the control device 164 and the sensor 5. In an embodiment, the separate device 166 is remote from both the sensor 5 and the control device 164, for example being a cloud server. In an embodiment, the separate device may be in physical proximity to the sensor 5 or the control device 164, for example being a controller for a process located in the same building or along a production line where sensor 5 is located, or, as further non-limiting examples, a mobile device such as a smart phone, tablet, computer, or the like. The processing of signals from sensor 5 results in a command for the control device 164 to implement. Sensor 5, control device 164, and optionally separate device 166 can respectively communicate with one another through any suitable wired connection or, as shown in the embodiment in FIG. 13, wireless communications or data connections such as Bluetooth, cellular data communications such 4G, 5G, LTE or the like, or Wi-Fi.

The terminology used in this specification is intended to describe particular embodiments and is not intended to be limiting. The terms "a," "an," and "the" include the plural forms as well, unless clearly indicated otherwise. The terms "comprises" and/or "comprising," when used in this specification, specify the presence of the stated features, integers, steps, operations, elements, and/or components, but do not preclude the presence or addition of one or more other features, integers, steps, operations, elements, and/or components.

The examples disclosed in this application are to be considered in all respects as illustrative and not limitative. The scope of the invention is indicated by the appended claims rather than by the foregoing description; and all changes which come within the meaning and range of equivalency of the claims are intended to be embraced therein.

The invention claimed is:

1. A system for determining a variability in a state of a medium, comprising:
   a sensor configured to monitor the medium, the sensor including:
      a transmit circuit configured to generate a plurality of transmit signals,
         wherein the transmit signals are in a microwave or radio frequency band and each of the plurality of transmit signals are transmitted into the medium at a different time;
      an antenna configured to receive return signals from the medium over time,
         wherein each of the return signals result from transmission of the plurality of transmit signals into the medium,
         wherein the antenna consists of a strip of conductive material having at least one lateral dimension thereof greater than a thickness dimension thereof, the strip of conductive material being disposed on a substrate; and
      a processor configured to process return signals received over time to determine the variability in the state of the medium over time.

2. The system of claim 1, further comprising a transmit antenna configured to transmit at least some of the plurality of transmit signals into the medium.

3. The system of claim 1, further comprising a vessel, wherein the vessel is configured to contain the medium.

4. The system of claim 3, wherein the vessel includes a fluid passage configured to allow a portion of the medium to be directed past the sensor.

5. The system of claim 4, further comprising a pump disposed along the channel.

6. The system of claim 1, further comprising a transmit element configured to transmit the plurality of transmit signals into the medium.

7. The system of claim 1, further comprising:
   a control device configured to affect the medium,
      wherein the control device is controlled based on the determined variability in the state of the medium over time.

8. The system of claim 7, wherein the control device includes one or more valves, flow directors, or fluid metering devices.

9. The system of claim 7, wherein the control device includes a mixer.

10. The system of claim 7, wherein the control device is configured to heat or cool the medium.

11. The system of claim 7, wherein the control device is configured to control flow of a compound being added to the medium.

12. The system of claim 1, wherein the processor is included in the sensor.

13. The system of claim 1, wherein the processor is included in a remote server.

14. The system of claim 1, further comprising a processor configured to determine presentation of a notification based on the determined variability in the state of the medium over time and direct presentation of the notification.

15. The system of claim 14, wherein the notification is determined based on the determined variability in the state of the medium over time exceeding an upper threshold.

16. The system of claim 14, wherein the notification is determined based on the determined variability in the state of the medium being below a lower threshold.

17. The system of claim 14, wherein the processor configured to determine the presentation of the notification is included in the sensor.

18. The system of claim 14, wherein the processor configured to determine the presentation of the notification is included in a remote server.

* * * * *